United States Patent
Kumada et al.

(10) Patent No.: US 10,818,789 B2
(45) Date of Patent: Oct. 27, 2020

(54) SEMICONDUCTOR DEVICE AND SEMICONDUCTOR CIRCUIT DEVICE

(71) Applicant: Fuji Electric Co., Ltd., Kanagawa (JP)

(72) Inventors: Keishirou Kumada, Nagano (JP); Yasuyuki Hoshi, Nagano (JP); Yoshihisa Suzuki, Nagano (JP); Yuichi Hashizume, Nagano (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 16/504,114

(22) Filed: Jul. 5, 2019

(65) Prior Publication Data
US 2020/0020800 A1 Jan. 16, 2020

(30) Foreign Application Priority Data
Jul. 13, 2018 (JP) ................ 2018-133617

(51) Int. Cl.
*H01L 29/78* (2006.01)
*H01L 23/00* (2006.01)
*H01L 29/423* (2006.01)
*H01L 29/16* (2006.01)

(52) U.S. Cl.
CPC .......... *H01L 29/7813* (2013.01); *H01L 24/09* (2013.01); *H01L 29/1608* (2013.01); *H01L 29/4236* (2013.01); *H01L 29/7805* (2013.01)

(58) Field of Classification Search
CPC . H01L 29/7813; H01L 24/09; H01L 29/1608; H01L 29/4236; H01L 29/7805
See application file for complete search history.

(56) References Cited

U.S. PATENT DOCUMENTS

| | | | |
|---|---|---|---|
| 2011/0278599 A1* | 11/2011 | Nakao | H01L 29/1095 257/77 |
| 2013/0187240 A1 | 7/2013 | Takano | |
| 2014/0183620 A1 | 7/2014 | Takaya et al. | |
| 2017/0040420 A1* | 2/2017 | Mori | H01L 27/04 |

FOREIGN PATENT DOCUMENTS

| | | |
|---|---|---|
| JP | 2011-061064 A | 3/2011 |
| JP | 2013-152981 A | 8/2013 |
| JP | 2014-130896 A | 7/2014 |

* cited by examiner

*Primary Examiner* — Fernando L Toledo
*Assistant Examiner* — Neil R Prasad
(74) *Attorney, Agent, or Firm* — Chen Yoshimura LLP

(57) ABSTRACT

In a transistor region of an active region, trench-gate MOS gates for a vertical MOSFET are formed on the front surface side of a semiconductor substrate. In a non-effective/pad region of the active region, a gate pad is formed on the front surface of the semiconductor substrate with an interlayer insulating film interposed therebetween. An n-type region is formed spanning across the entire non-effective region in the surface layer of the front surface of the semiconductor substrate. The portion directly beneath the gate pad is only an n-type region constituted by an $n^+$ starting substrate, an $n^-$ drift region, and the n-type region, with the interlayer insulating film sandwiched thereabove. No $n^+$ source region is formed in a p-type base region extension which is the portion of a p-type base region that extends into the non-effective region.

19 Claims, 14 Drawing Sheets

SEMICONDUCTOR DEVICE AND SEMICONDUCTOR CIRCUIT DEVICE

BACKGROUND OF THE INVENTION

Technical Field

The present invention relates to a semiconductor device and a semiconductor circuit device.

Background Art

Silicon (Si) has conventionally been used as the material for power semiconductor devices for controlling high voltages and high currents. There are various types of power semiconductor devices, such as bipolar transistors, insulated-gate bipolar transistors (IGBTs), and metal-oxide-semiconductor field-effect transistors (MOSFETs) that have an insulated gate constituted by a three-layer metal-oxide-semiconductor structure, and these devices are used for different purposes according to the use case.

For example, bipolar transistors and IGBTs offer higher current densities than MOSFETs and make it possible to work with higher currents but cannot be switched at high speeds. More specifically, bipolar transistors are limited to being used at switching frequencies on the order of several kHz, and IGBTs are limited to being used at switching frequencies on the order of several dozen kHz. Power MOSFETs, on the other hand, have lower current density than bipolar transistors and IGBTs and make it difficult to work with high currents but can be operated at high switching speeds on the order of several MHz. Moreover, due to their structure, MOSFETs have a built-in parasitic diode formed by the p-n junction between a p-type base region and an $n^-$ drift region. This parasitic diode can be used as a freewheeling diode for protecting the MOSFET when using the MOSFET as a device for an inverter.

Furthermore, there is strong commercial demand for power semiconductor devices that can both handle large currents and offer good high-speed performance. A great deal of effort has been expended improving IGBTs and power MOSFETs, and currently, these devices have been developed to substantially near the performance limits of the materials being used. Therefore, there is various ongoing research on semiconductor materials that can replace silicon in power semiconductor devices, and silicon carbide (SiC) has attracted attention as a semiconductor material that could potentially make it possible to make (manufacture) next-generation power semiconductor devices with low on-voltages and excellent high-speed and high-temperature performance. Moreover, due to the ability for the built-in parasitic diode to be used as a freewheeling diode as described above, MOSFETs eliminate the need to add and connect external freewheeling diodes and have drawn attention from an economic perspective as well.

Silicon carbide is a semiconductor material with exceptional chemical stability that also has a wide bandgap of 3 eV and can be used as a semiconductor in an extremely stable manner even at high temperatures. Moreover, silicon carbide has a maximum field strength of at least an order of magnitude greater than that of silicon and therefore shows potential as a semiconductor material that could make it possible to sufficiently reduce on-resistance. These advantageous properties of silicon carbide are also exhibited by other semiconductors that have a wider bandgap than silicon (hereinafter, "wide-bandgap semiconductors"). Furthermore, similar to silicon, due to exhibiting rectifying properties when used in conjunction with a metal, wide-bandgap semiconductors can also be used to make (manufacture) Schottky barrier diodes (SBDs). For these reasons, using a wide-bandgap semiconductor as a substrate material makes it possible to create SBDs with high breakdown voltage and low on-resistance.

Next, a semiconductor circuit device in which silicon carbide SBDs (hereinafter, "SiC SBDs") are connected in anti-parallel to silicon carbide MOSFETs (hereinafter, "SiC MOSFETs") and the SiC MOSFETs are switched ON and OFF to pass current through an inductive load and thereby achieve an inverter operation will be described. FIG. 18 is a circuit diagram illustrating the circuit configuration of a typical semiconductor circuit device. In FIG. 18, two phases in the circuit configuration of this three-phase inverter are not illustrated in the figure. The semiconductor circuit device illustrated in FIG. 18 is an inverter with a full-bridge circuit configuration which converts DC voltage to AC voltage by switching four MOSFETs 101 to 104 ON and OFF.

The drains of the high-side (power supply line-side) MOSFETs 101 and 103 are connected to the positive electrode side of a DC power supply 105. The sources of the high-side MOSFETs 101 and 103 are respectively connected to the drains of the low-side (ground-side) MOSFETs 102 and 104. The sources of the low-side MOSFETs 102 and 104 as well as the negative electrode side of the DC power supply 105 are grounded. An inductive load L which has an inductance component is connected between the source of the MOSFET 101 and drain of the MOSFET 102 and the source of the MOSFET 103 and drain of the MOSFET 104.

The MOSFETs 101 to 104 respectively have built-in parasitic diodes 111 to 114 formed by the p-n junction between a p-type base region and an $n^-$ drift region. Moreover, external SBDs 121 to 124 which are manufactured on different semiconductor substrates from the MOSFETs 101 to 104 are respectively connected in anti-parallel to the MOSFETs 101 to 104. The MOSFETs 101 to 104 are SiC MOSFETs. The SBDs 121 to 124 are SiC SBDs. Input circuits 131 to 134 which respectively input gate voltages to the MOSFETs 101 to 104 are respectively connected to the gates of the MOSFETs 101 to 104.

In the inverter illustrated in FIG. 18, an output voltage is controlled by alternately passing current through the diagonally arranged MOSFET 101 and MOSFET 104 and the diagonally arranged MOSFET 102 and MOSFET 103 in order to alter the pulse width (the pulse ON time). As illustrated by the solid arrow, when the MOSFET 101 and the MOSFET 104 are conducting current, a current I101 flows through the inductive load L along a path 141 going from the positive electrode side of the DC power supply 105 through the MOSFET 101, the inductive load L, and the MOSFET 104 towards the low side.

If the MOSFETs 101 and 104 are switched OFF while the current I101 is flowing through the inductive load L along this path 141, freewheeling diodes of the MOSFETs 102 and 103 conduct current in the forward direction in order to allow the current in the inductive load L to continue flowing, thereby resulting in commutation of the current flowing through the inductive load L. At this time, if the parasitic diodes 112 and 113 of the MOSFETs 102 and 103 conduct current in the forward direction as the freewheeling diodes, crystal defects begin to develop in the semiconductor substrates of the MOSFETs 102 and 103 due to recombination of minority carriers (holes) injected from the p-type base regions into the $n^-$ drift regions of the MOSFETs 102 and 103.

In order to prevent crystal defects from developing in the semiconductor substrates, the SBDs 122 and 123 are connected in anti-parallel to the MOSFETs 102 and 103 as freewheeling diodes. Therefore, as illustrated by the dashed arrow, the current flowing through the inductive load L becomes a current 1102 which flows through the SBDs 122 and 123 along a path 142 going through the SBD 122 connected to the MOSFET 102 (currently in the OFF state), the inductive load L, and the SBD 123 connected to the MOSFET 103 (currently in the OFF state) towards the positive electrode side of the DC power supply 105. As a result, the energy of the inductive load L is regenerated.

Although this is not illustrated in the figure, when the MOSFET 102 and the MOSFET 103 are conducting current, current flows through the inductive load L along a path going from the positive electrode side of the DC power supply 105 through the MOSFET 103, the inductive load L, and the MOSFET 102 towards the low side. This current flowing through the inductive load L then flows through the SBD 124 connected to the MOSFET 104 (currently in the OFF state), the inductive load L, and the SBD 121 connected to the MOSFET 101 (currently in the OFF state) towards the positive electrode side of the DC power supply 105, thereby regenerating the energy of the inductive load L.

Next, the configuration of a conventional MOSFET used for the MOSFETs 101 to 104 will be described. FIG. 19 is a cross-sectional view illustrating the structure of a conventional semiconductor device. The conventional semiconductor device illustrated in FIG. 19 is a vertical MOSFET including a trench-gate MOS gate on the front surface side of a semiconductor substrate 210, and this device has, in an active region 201, an effective region 201a (also referred to as "transistor region" which functions as a MOSFET and a non-effective region 201b (also referred to as "pad region") which does not function as a MOSFET. The active region 201 is the region through which a primary current flows when the device is in the ON state.

In the effective region 201a, MOSFET unit cells (the structural unit of the device) and a source electrode 221 are formed. The source electrode 221 also serves as a source pad. The reference characters 211 to 219 and 223 are an $n^+$ drain region, $n^-$ drift region, p-type base region, $n^+$ source region, $p^+$ contact region, trench, gate insulating film, gate electrode, interlayer insulating film, and drain electrode of the MOSFET. The reference character 231 is a $p^+$ region which serves to reduce the electric field applied to the gate insulating film when the MOSFET is OFF as well as to improve the breakdown voltage.

In the non-effective region 201b, an insulating film 220 and an electrode pad such as a gate pad 222 with the interlayer insulating film 219 interposed therebeneath are formed on the front surface of the semiconductor substrate 210. Moreover, no MOSFET unit cells are formed in the non-effective region 201b. In the non-effective region 201b, a second p-type base region 233 is formed in the surface layer of the front surface of the semiconductor substrate 210 and spans across substantially the entire non-effective region 201b. The second p-type base region 233 faces the gate pad 222 in the depth direction Z with the insulating film 220 and the interlayer insulating film 219 sandwiched therebetween.

The second p-type base region 233 contacts the first p-type base region 213. In the portion of the first p-type base region 213 sandwiched between the second p-type base region 233 and the trench 216 on the side closest to the non-effective region 201b, no $n^+$ source region 214 is formed. A $p^+$ contact region 234 is selectively formed within the second p-type base region 233. The second p-type base region 233 is electrically connected to the source electrode 221 via the $p^+$ contact region 234 near the boundary between the effective region 201a and the non-effective region 201b.

Meanwhile, a vertical planar-gate silicon MOSFET in which a p-type base region is formed within an $n^-$ drain region so as to surround the periphery of a pad region in which a gate pad is formed and only the $n^-$ drain region is present directly beneath the pad region has been proposed as another conventional MOSFET (see Patent Document 1 (paragraphs [0014] and and FIG. 2), for example).

Furthermore, a vertical planar-gate SiC MOSFET in which a p-type region directly beneath (on the drain side of) a gate pad is set to a source voltage and no $p^+$ region is formed within this p-type region has also been proposed as another conventional MOSFET (see Patent Document 2 (paragraphs [0029] and [0031] and FIG. 6), for example).

In addition, a vertical trench-gate SiC MOSFET in which the voltage of a p-type region directly beneath a gate pad is floated and no $p^+$ region is formed within this p-type region has also been proposed as another conventional MOSFET (see Patent Document 3 (paragraph [0024] and FIG. 2), for example).

RELATED ART DOCUMENTS

Patent Documents

Patent Document 1: Japanese Patent Application Laid-Open Publication No. 2013-152981
Patent Document 2: Japanese Patent Application Laid-Open Publication No. 2011-061064
Patent Document 3: Japanese Patent Application Laid-Open Publication No. 2014-130896

SUMMARY OF THE INVENTION

However, it was discovered that if the SiC MOSFET illustrated in FIG. 19 or the MOSFET disclosed in any of Patent Documents 1 to 3 is used for the MOSFETs 101 to 104 in FIG. 18 to make an inverter perform a commutation operation, during a transient period in which the MOSFETs 101 and 104 are switched from ON to OFF (see FIG. 18), the transient current cannot be made to flow only through the SBDs 122 and 123 and a portion of this transient current ends up flowing through the parasitic diodes 112 and 113 of the MOSFETs 102 and 103. FIG. 20 is a graph showing the current waveforms of transient currents that, when the inverter performs a commutation operation, respectively flow through the SBDs (through which freewheeling current flows) and the parasitic diodes of the MOSFETs to which those SBDs are reverse-connected.

In FIG. 20, the reference characters 251 to 254 are respectively current waveforms that manifest when the current flowing through the inductive load L is commutated by switching the MOSFETs 101 and 104 from ON to OFF. The reference character 251 is the current waveform of the current that flows through the MOSFETs 101 and 104 upon reaching steady-state after being switched from ON to OFF. The reference character 252 is the current waveform of the transient current that flows through the parasitic diodes 112 and 113 of the MOSFETs 102 and 103. The reference character 253 is the current waveform of the freewheeling current that flows through the SBDs 122 and 123. The reference character 254 is the current waveform of the transient current that flows through the SBDs 122 and 123.

When the MOSFETs 102 and 103 are switched from ON to OFF, the transient current 252 flows through the parasitic diodes 111 and 114 of the MOSFETs 101 and 104. The transient currents 252 and 254 are currents that flow transiently at the moment the MOSFETs 101 to 104 are switched from ON to OFF. Thus, even if the SBDs 121 to 124 are respectively connected in anti-parallel to the MOSFETs 101 to 104 as freewheeling diodes, the transient current 252 still flows through the parasitic diodes 111 to 114 of the MOSFETs 101 to 104 in the forward direction. Therefore, as described above, recombination of minority carriers causes crystal defects to develop in the semiconductor substrates of the MOSFETs 101 to 104.

In order to solve the problems in the conventional technologies described above, the present invention aims to provide a semiconductor device and a semiconductor circuit device that make it possible to inhibit formation of crystal defects in a semiconductor substrate.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device having defined therein, in a plan view, a transistor region where one or more trench-gate field effect transistors are disposed and a pad region where one or more pads are disposed and transistors are absent, the semiconductor device including: a semiconductor substrate made of a semiconductor with a wider bandgap than silicon, the semiconductor substrate including: a bottom substrate of a first conductivity type; a lower semiconductor layer of the first conductivity type formed on the bottom substrate; and an upper semiconductor layer of a second conductivity type formed on the lower semiconductor layer as an uppermost layer of the semiconductor substrate, wherein in the transistor region, a source region of the first conductivity type is selectively formed and embedded within the upper semiconductor layer in a top surface of the semiconductor substrate, and a portion of the upper semiconductor layer other than the source region, including underneath the source region, is defined as a base region of the second conductivity type, wherein in the transistor region, the semiconductor device further comprises: a trench that penetrates from above through the source region and the base region thereunder and that reaches the lower semiconductor layer; a gate electrode formed inside the trench with a gate insulating film interposed therebetween; a source electrode that is formed over the top surface of the semiconductor substrate and that contacts the source region and is electrically connected to the base region; and a drain electrode that is formed on a bottom surface of the semiconductor substrate, and wherein in the pad region, the semiconductor device comprises: an interlayer insulating film on the top surface of the semiconductor substrate; an electrode pad on the interlayer insulating film, the electrode pad being electrically separated from the source electrode so as to receive a voltage independently from a voltage to be applied to the source electrode; and a continuous region of the first conductivity type embedded in the upper semiconductor layer, the continuous region continuously spanning from the top surface of the semiconductor substrate and reaching the lower semiconductor layer.

In the above-mentioned semiconductor device, at or adjacent to a boundary between the transistor region and the pad region, the upper semiconductor layer of the second conductivity type may laterally extend from a vertical wall of the trench in the transistor region into the pad region up to a prescribed lateral distance terminating at an edge of the continuous region. Said upper semiconductor layer that laterally extends into the pad region may at least partially surround a periphery of a region in which the electrode pad is arranged. Further, said upper semiconductor layer that laterally extends into the pad region may not have any embedded region of the first conductivity type therein.

In the above-mentioned semiconductor device, the upper semiconductor layer abutting another vertical wall of the trench may include said source region abutting said another vertical wall of the trench embedded therein The above-mentioned semiconductor device may further include in the transistor region: a first region of the second conductivity type selectively formed in the lower semiconductor layer at a bottom of the trench, the first region being vertically separated from the base region and extending downwardly to a prescribed depth towards bottom surface; and a second region of the second conductivity type selectively formed in the lower semiconductor layer, laterally separated from the first region, the second region contacting the base region and extending downwardly to a prescribed depth towards the bottom surface.

In the above-mentioned semiconductor device, in the transistor region, the trench may be provided in a plurality, and the second region may contact a center portion of the base region that are sandwiched by adjacent two trenches of the plurality of the trenches.

In the above-mentioned semiconductor device, at or adjacent to a boundary between the transistor region and the pad region, the upper semiconductor layer of the second conductivity type may laterally extend from a vertical wall of the trench in the transistor region into the pad region up to a prescribed lateral distance terminating at an edge of the continuous region, and in the pad region, a region of the second conductivity type may be selectively formed in the lower semiconductor layer, contacting said upper semiconductor layer that laterally extends into the pad region and extending downwardly to a prescribed depth towards the bottom surface, said region of the second conductivity type contacting said upper semiconductor layer that laterally extends into the pad region at a position closer to an lateral extended edge of said upper semiconductor layer that laterally extends into the pad region than the vertical wall of the trench.

In the above-mentioned semiconductor device, in the pad region, in a plan view, said continuous region of the first conductivity type may occupy at least an entire area underneath the electrode pad.

In the above-mentioned semiconductor device, an impurity concentration of said continuous region of the first conductivity type may be greater than an impurity concentration of the lower semiconductor layer.

In the above-mentioned semiconductor device, said continuous region of the first conductivity type may face the electrode pad in a depth direction with the interlayer insulating film sandwiched therebetween.

The above-mentioned semiconductor device may further include in the pad region: a floated region of the second conductivity type, electrically floated, spanning from the top surface of the semiconductor substrate to a prescribed depth, wherein the floated region faces the electrode pad in a depth direction with the interlayer insulating film sandwiched therebetween.

Furthermore, in the above-mentioned semiconductor device, said continuous region of the first conductivity type may extend downwardly to an intermediate depth within the lower semiconductor layer, thereby a lower portion thereof being embedded in the lower semiconductor layer, and an impurity concentration of said continuous region of the first conductivity type may be greater than an impurity concentration of the lower semiconductor layer.

In another aspect, the present disclosure provides a semiconductor circuit device that includes: the above-described semiconductor device; and a diode device that comprises: another semiconductor substrate of the first conductivity type made of a semiconductor with a wider bandgap than silicon; a region of the second conductivity type selectively formed in said another semiconductor substrate and exposed at a top surface of said another semiconductor substrate; an upper electrode formed on the top surface of said another semiconductor substrate, contacting said region of the second conductivity type, the upper electrode being electrically connected to the source electrode of the semiconductor device; and an ohmic electrode formed on a bottom surface of said another semiconductor substrate, the ohmic electrode being electrically connected to the drain electrode of the semiconductor device.

In the invention as described above, no MOSFET parasitic diode is formed directly beneath the electrode pad. Therefore, during a transient period in which the MOSFET (which is a device for an inverter) is switched from ON to OFF, a MOSFET parasitic diode only operates in the transistor region of the first semiconductor substrate. This makes it possible to increase the forward voltage applied to the parasitic diode of the MOSFET, which causes transient current to flow only through an external SBD connected in anti-parallel to the MOSFET and to not flow through the parasitic diode of the MOSFET.

The semiconductor device and semiconductor circuit device according to the present invention make it possible to inhibit formation of crystal defects in a semiconductor substrate of a MOSFET used as a device for an inverter.

It is to be understood that both the foregoing general description and the following detailed description are exemplary and explanatory, and are intended to provide further explanation of the invention as claimed

DETAILED DESCRIPTION OF EMBODIMENTS

Figure 1:
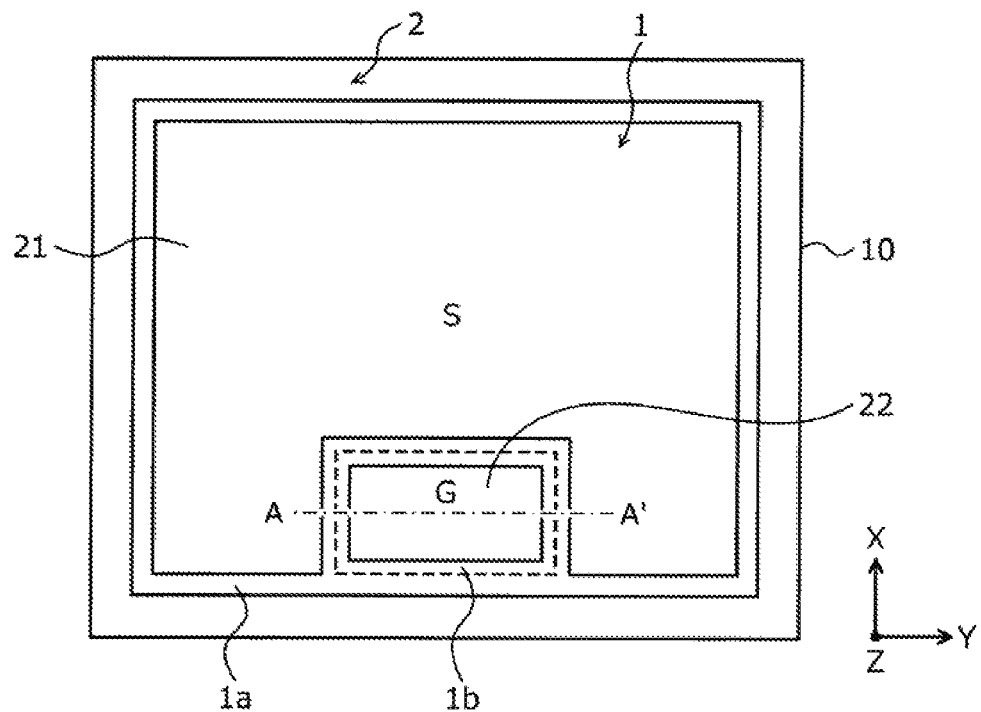
FIG. 1 is a plan view illustrating the layout of a semiconductor device according to Embodiment 1 as viewed from the front surface side of a semiconductor substrate.

Preferred embodiments of a semiconductor device and a semiconductor circuit device according to the present invention will be described in detail below with reference to the attached drawings. In the present specification and the attached drawings, the letters "n" and "p" are used to indicate whether the majority carriers in a layer or region are electrons or holes, respectively. Moreover, the symbols + and − are appended to the letters n⁻ and p to indicate layers or regions having a higher impurity concentration or lower impurity concentration, respectively, than layers or regions in which the + and − symbols are not appended. Furthermore, in the following descriptions of the embodiments and the attached drawings, the same reference characters are used to indicate components that are the same, and redundant descriptions of such components will be omitted. In the Miller index notation used in the present specification, the symbol − indicates a bar to be applied to the immediately following index; that is, the symbol − is inserted before an index to indicate that that index is negative.

Embodiment 1

Figure 2:
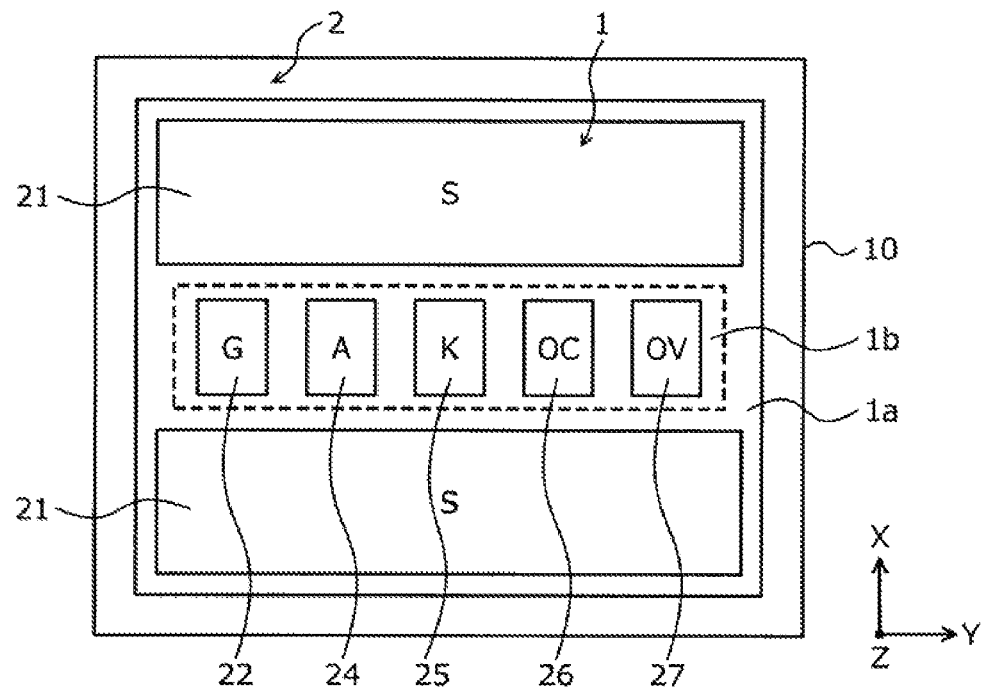
FIG. 2 is a plan view illustrating another example of a layout for the semiconductor device according to Embodiment 1 as viewed from the front surface side of the semiconductor substrate.
Figure 3:
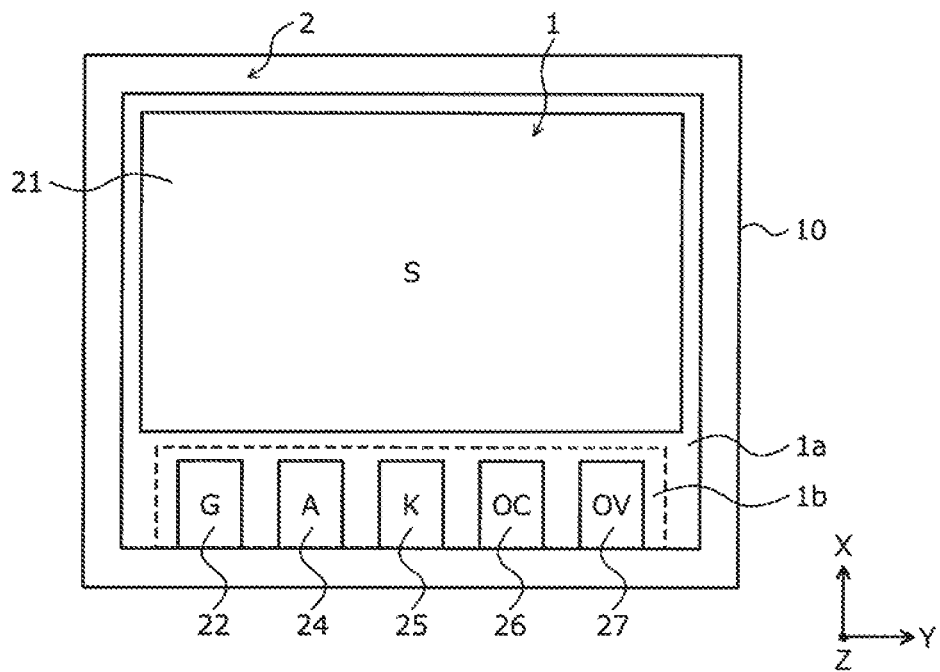
FIG. 3 is a plan view illustrating another example of a layout for the semiconductor device according to Embodiment 1 as viewed from the front surface side of the semiconductor substrate.
Figure 4:
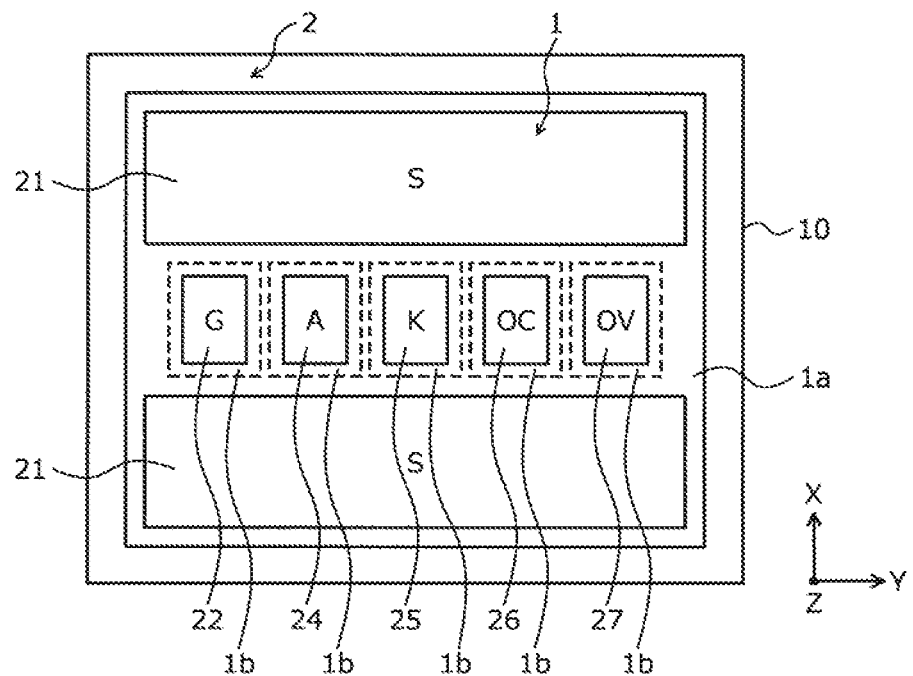
FIG. 4 is a plan view illustrating another example of a layout for the semiconductor device according to Embodiment 1 as viewed from the front surface side of the semiconductor substrate.

A semiconductor device according to Embodiment 1 is made using a semiconductor that has a wider bandgap than silicon (Si) (hereinafter, a "wide-bandgap semiconductor"). Next, the structure of the semiconductor device according to Embodiment 1 will, on the basis of an example of using silicon carbide (SiC), for example, as the wide-bandgap semiconductor, be described with reference to FIGS. 1 to 7 and FIG. 18. FIG. 1 is a plan view illustrating the layout of the semiconductor device according to Embodiment 1 as viewed from the front surface side of a semiconductor substrate. FIGS. 2 to 4 are plan views illustrating other examples of layouts for the semiconductor device according to Embodiment 1 as viewed from the front surface side of the semiconductor substrate.

Figure 5:
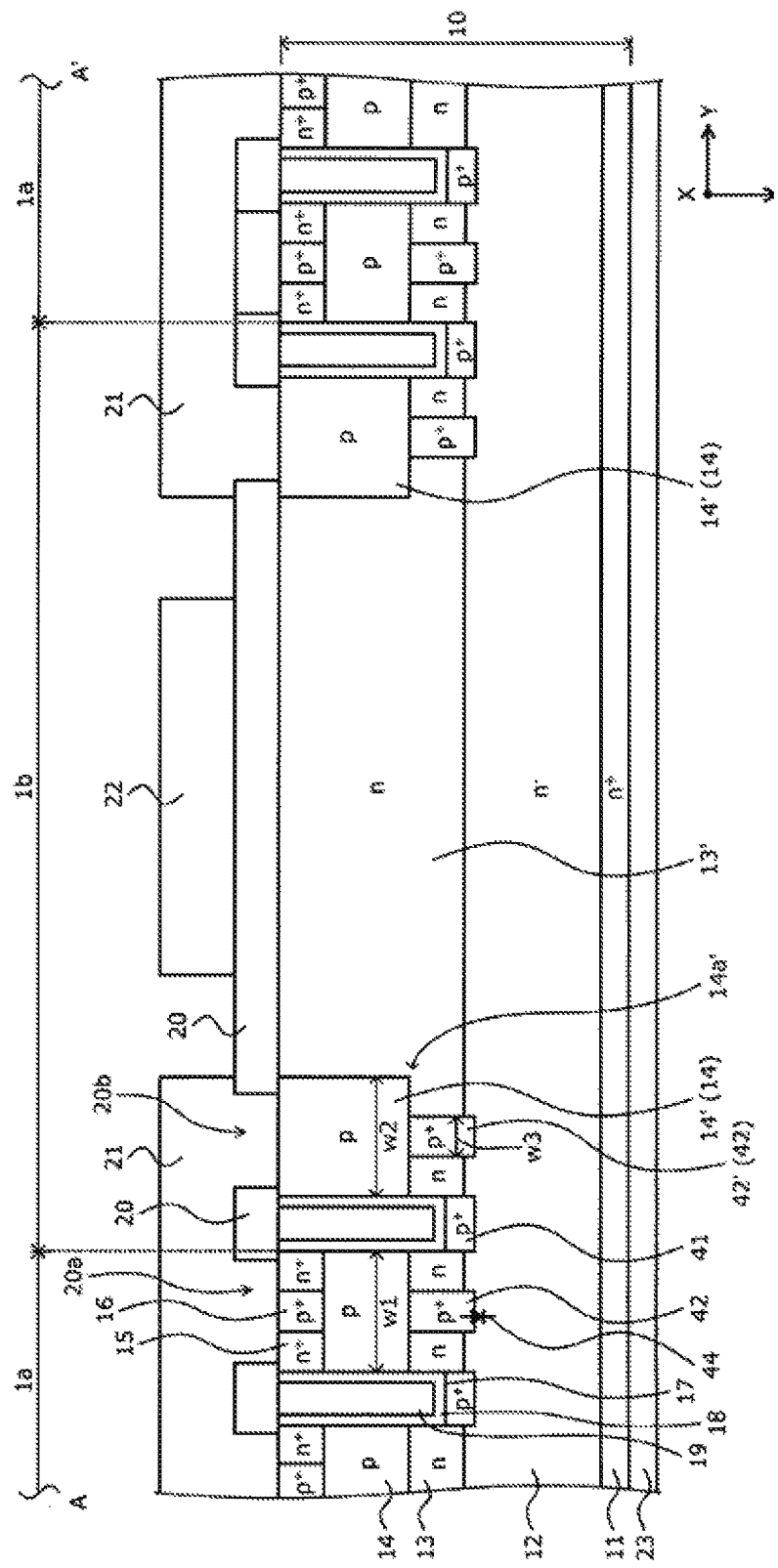
FIG. 5 is a cross-sectional view illustrating a cross section taken along line A-A' in FIG. 1.
Figure 6:
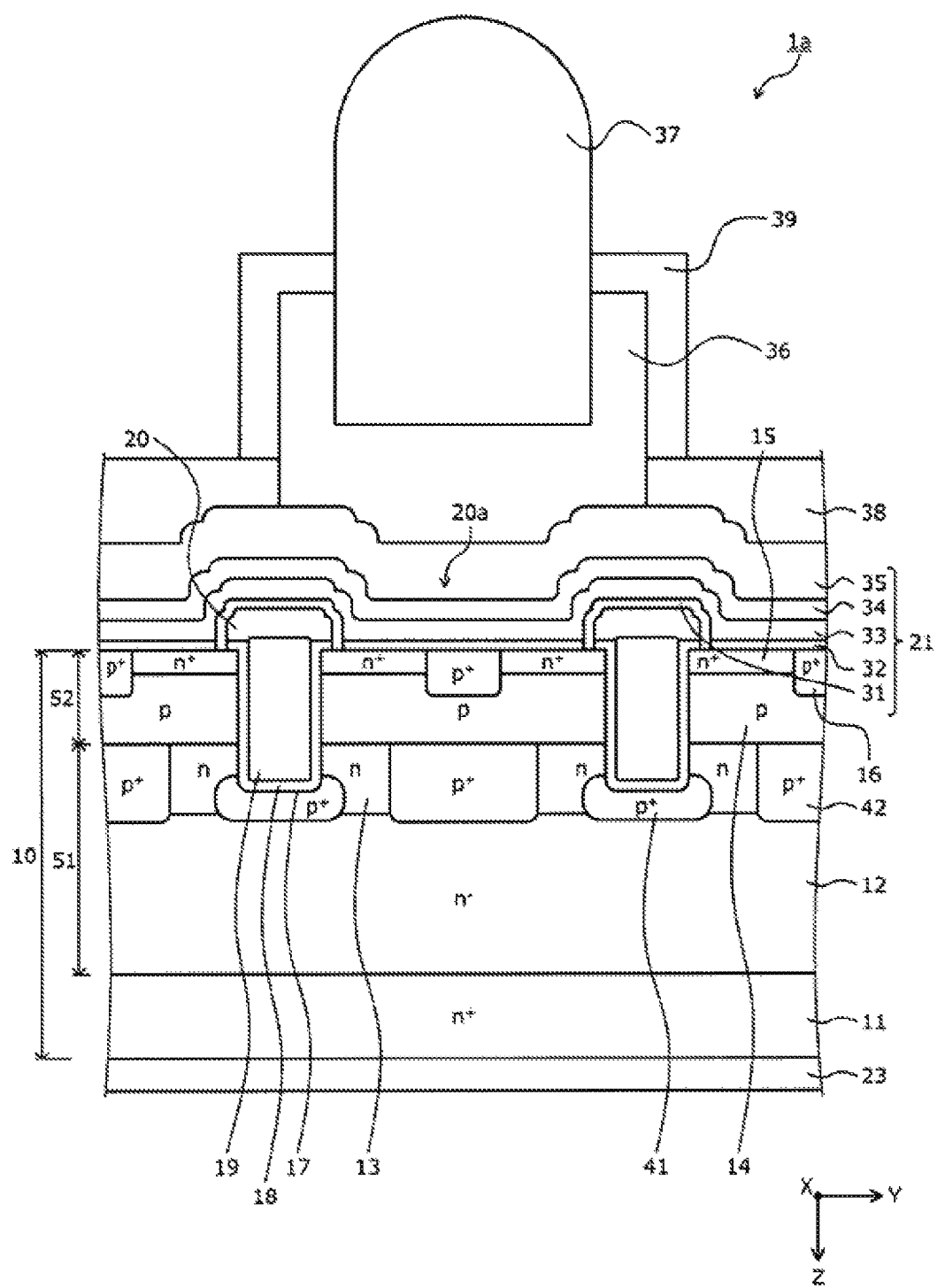
FIG. 6 is a cross-sectional view illustrating the structure of the semiconductor device according to Embodiment 1.
Figure 7:
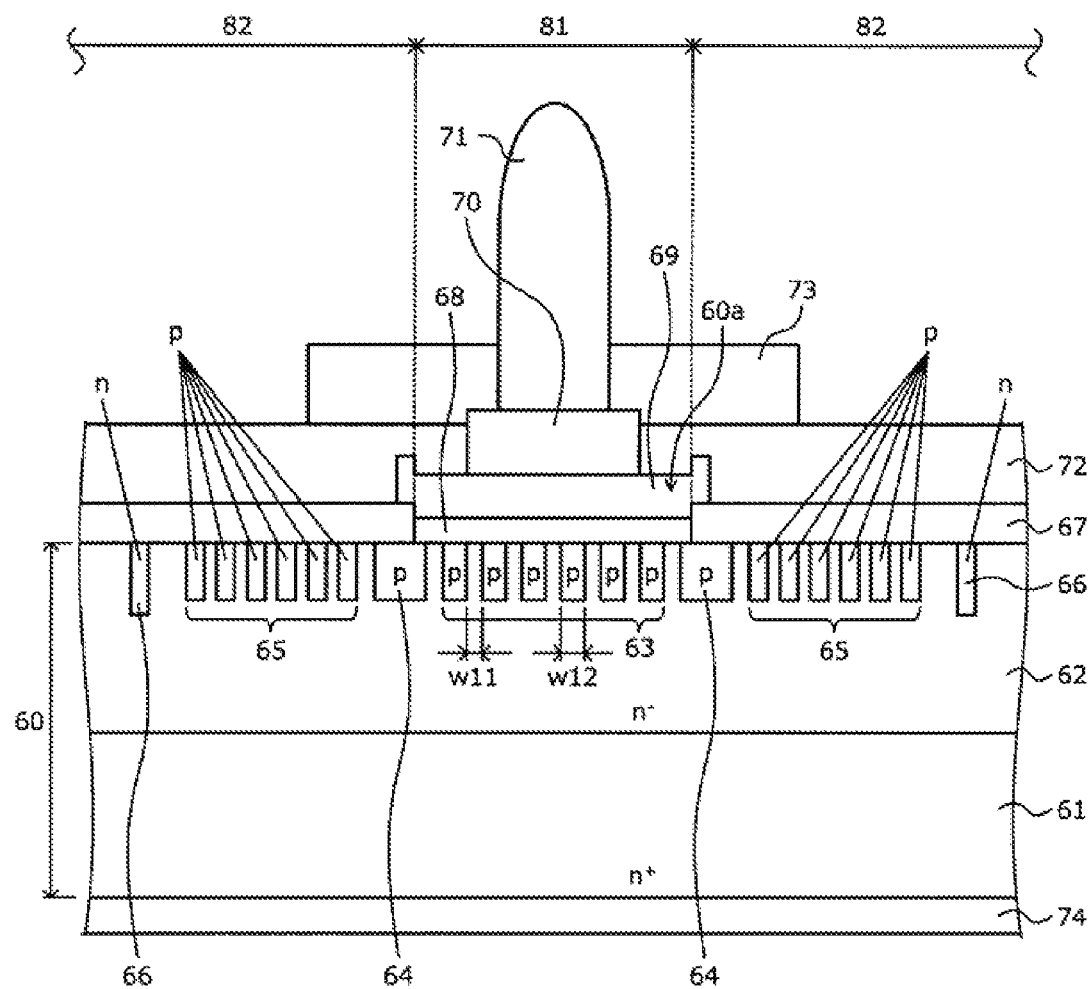
FIG. 7 is a cross-sectional view illustrating the structure of an SBD for use in an inverter illustrated in FIG. 18.
Figure 18:
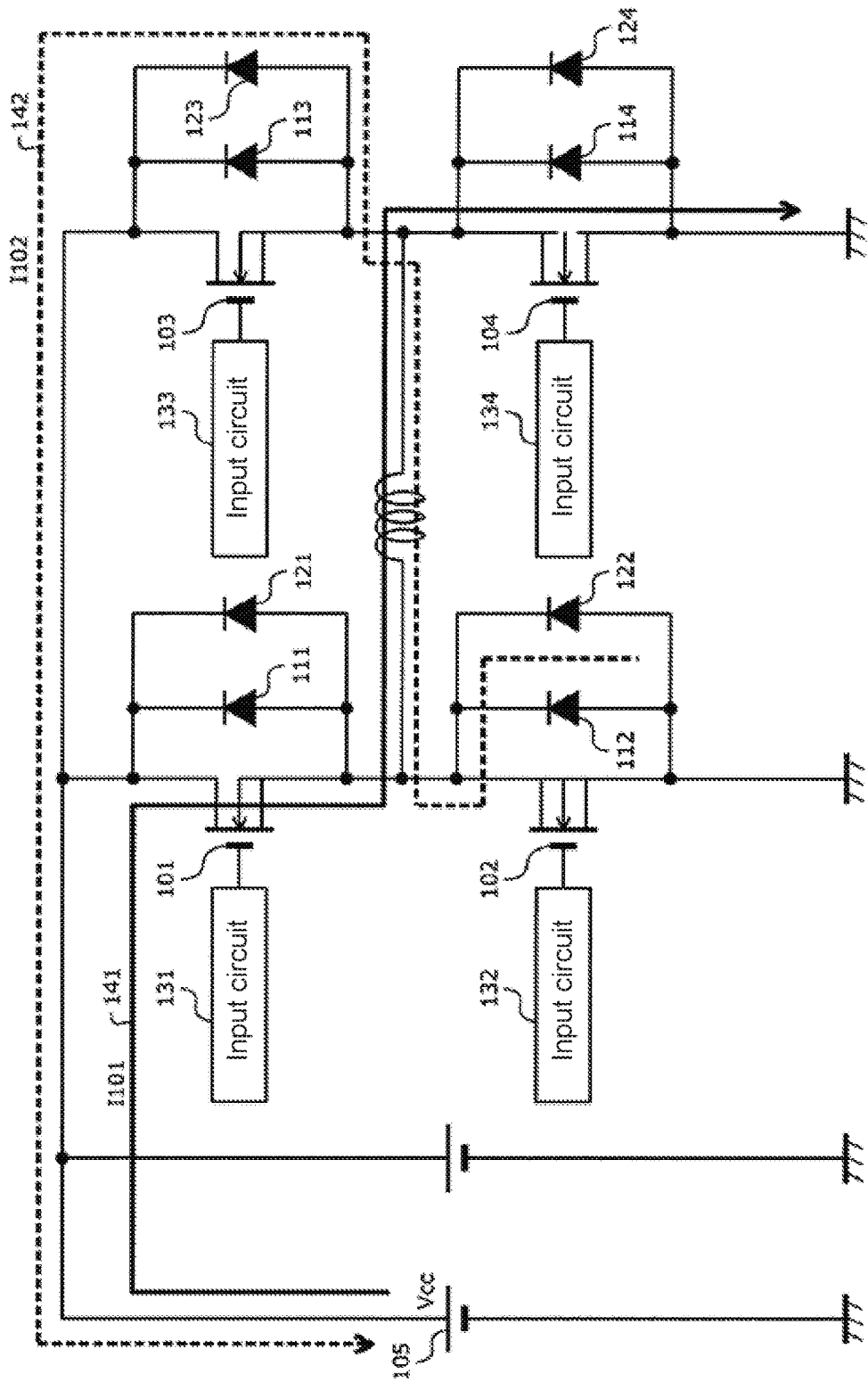
FIG. 18 is a circuit diagram illustrating the circuit configuration of a typical semiconductor circuit device.

FIGS. 1 to 4 illustrate layouts for a semiconductor substrate (first semiconductor substrate (semiconductor chip)) 10 on which a MOSFET is formed for use as MOSFETs 101 to 104 of the inverter illustrated in FIG. 18. FIG. 5 is a cross-sectional view illustrating a cross section taken along line A-A' in FIG. 1. FIG. 6 is a cross-sectional view illustrating the structure of the semiconductor device according to Embodiment 1. FIG. 6 illustrates an example of a unit cell structure for the MOSFET formed in an effective region 1a. FIG. 7 is a cross-sectional view illustrating the structure of an SBD for use in the inverter illustrated in FIG. 18. FIG. 7 illustrates an example of a structure for an SiC SBD to be used for SBDs 121 to 124 of the inverter illustrated in FIG. 18.

The semiconductor device according to Embodiment 1 and illustrated in FIGS. 1, 5, and 6 is a vertical SiC MOSFET including trench-gate MOS gates formed on the front surface (top surface) side of a semiconductor substrate 10 made of silicon carbide, and this device is intended to be used for the MOSFETs 101 to 104 of the inverter illustrated in FIG. 18. The configuration of the inverter illustrated in FIG. 18 is the same as that of a conventional inverter and therefore will not be described here. An active region 1 of the semiconductor substrate 10 includes an effective region 1a which functions as a MOSFET (also referred to as "transistor region") and a non-effective region 1b which does not function as a MOSFET (also referred to as "pad region". The active region 1 is the region through which a primary current flows when the device is in the ON state. The periphery of the active region 1 is surrounded by an edge termination region 2.

In the effective region 1a, MOSFET unit cells (see FIGS. 5 and 6) and a source pad (first electrode) 21 are formed. The MOSFET unit cells are formed spanning across the entire effective region 1a. The source pad 21 covers substantially the entire front surface of the semiconductor substrate 10 in the effective region 1a. In other words, the planar shape of the source pad 21 is substantially the same as the planar shape of the effective region 1a. The effective region 1a is all of the portions of the active region 1 other than the non-effective region 1b and occupies a greater surface area than the non-effective region 1b. The surface area of the effective region 1a can be modified in various ways in accordance with the desired specifications and is determined by the desired current capacity or the like of the MOSFET, for example. Although in the drawings, the boundary between the transistor/effective region 1a and the pad/non-effective region 1b is drawn so as not to include a trench 17 that is closest to a pad 22 inside the transistor region 1a, the boundary may be shifted so as to include such a trench in the transistor region 1a.

In the non-effective region 1b, at least one electrode pad among a gate pad (electrode pad) 22 and electrode pads of circuits for protecting/controlling the MOSFET in the effective region 1a is formed separated from the source pad 21. Examples of circuits for protecting/controlling the MOSFET in the effective region 1a include high-functionality units such as current sensors, temperature sensors, overvoltage protection units, and arithmetic circuits, for example. The non-effective region 1b may have a substantially rectangular planar shape of a size that precisely accommodates all of these electrode pads, for example. Alternatively, a plurality of non-effective regions 1b each having a planar shape of substantially the same size as a single electrode pad and corresponding in number to the number of electrode pads may be formed, for example.

More specifically, when a trench 17 of a MOS gate (described later) is arranged in a stripe shape extending in a direction (hereinafter, "first direction") X parallel to the front surface of the semiconductor substrate 10, for example, the non-effective region 1b is the portion further on the gate pad 22 side in the first direction X than an $n^+$ source region (first semiconductor region) 15 arranged closest to the electrode pad side (in FIG. 1, the gate pad 22 side). Moreover, the non-effective region 1b is the portion that is further on the gate pad 22 side in a direction (hereinafter, "second direction") Y parallel to the front surface of the semiconductor substrate 10 and orthogonal to the first direction X than is the trench 17 arranged closest to the gate pad 22 side.

The gate pad 22 and the electrode pads of the high-functionality units each have a substantially rectangular planar shape, for example, and are arranged separated from one another. For example, when only the gate pad 22 is to be arranged in the non-effective region 1b, a single non-effective region 1b may be allocated near the boundary between the active region 1 and the edge termination region 2 (FIG. 1). In this case, the source pad 21 may have a substantially rectangular shape having a recess surrounding three sides of the non-effective region 1b that has a substantially rectangular planar shape, for example. In FIG. 1, the dashed line surrounding the gate pad 22 indicates the non-effective region 1b. Similarly, in FIGS. 2 to 4, the dashed lines surrounding the electrode pads indicate the non-effective region(s) 1b.

Furthermore, as illustrated in FIG. 2, when the gate pad 22 and all of the electrode pads of the high-functionality units are to be arranged within a single non-effective region 1b, for example, a single and substantially rectangular non-effective region 1b of a size that will accommodate all of these electrode pads may be allocated in the center of the active region 1, and all of the electrode pads may be arranged within this single non-effective region 1b in a line that runs along one side (the long side, for example) of the non-effective region 1b. In this case, two source pads 21 facing one another with all of the electrode pads that are arranged in a line disposed therebetween are arranged in the effective region 1a.

Moreover, as illustrated in FIG. 3, when the gate pad 22 and all of the electrode pads of the high-functionality units are to be arranged within a single non-effective region 1b, for example, a single non-effective region 1b of a size that will accommodate all of these electrode pads may be allocated along the boundary between the active region 1 and the edge termination region 2, and all of the electrode pads may be arranged within this single non-effective region 1b in a line that runs along one side (the long side, for example) of the non-effective region 1b. In this case, a single source pad 21 facing all of the electrode pads that are arranged in a line is arranged in the effective region 1a.

In addition, when the gate pad 22 and the electrode pads of the high-functionality units are to be respectively arranged in different non-effective regions 1b, for example, a plurality of non-effective regions 1b equal in number to the number of these electrode pads are allocated separated from one another. The electrode pads may be arranged in a line in the center of the active region 1 similar to in the layout illustrated in FIG. 2, or the electrode pads may be arranged along the boundary between the active region 1 and the edge termination region 2 similar to in the layout illustrated in FIG. 3, for example. Here, a different electrode pad is respectively arranged within each of the plurality of non-effective regions 1b. The space between adjacent non-effective regions 1b is the effective region 1a and functions as the MOSFET (FIG. 4).

Next, circuits for protecting/controlling the MOSFET in the effective region 1a will be described. A current sensor detects overcurrent (OC) flowing through the MOSFET in the effective region 1a. The current sensor is a vertical SiC MOSFET having unit cells of the same structure as the MOSFET in the effective region 1a and operates under the same conditions as the MOSFET in the effective region 1a. The current sensor may be constituted by several unit cells (approximately 10-20, for example) among the MOSFET unit cells (approximately 10,000, for example) arranged in the effective region 1a, for example.

A temperature sensor detects the temperature of the MOSFET in the effective region 1a by utilizing the temperature characteristics of a diode. For example, a p-type anode region of the temperature sensor has a substantially circular planar shape and is arranged in the non-effective region 1b, and an n-type cathode region has a substantially ring-shaped planar shape which surrounds the periphery of the p-type anode region. An overvoltage protection unit is a diode which protects the MOSFET in the effective region 1a from overvoltage (OV) resulting from surges or the like, for example. The current sensor, the temperature sensor, and the overvoltage protection unit are controlled by an arithmetic circuit, and the MOSFET in the effective region 1a is controlled on the basis of the output signals of these circuits.

In the temperature sensor, an electrode pad for the anode voltage (hereinafter, "anode pad") 24 and an electrode pad for the cathode voltage (hereinafter, "cathode pad") 25 should be arranged near a region of the MOSFET in the effective region 1a through which a large amount of current flows (such as the center of the active region 1). In FIGS. 1 to 4, the source pad 21 and the gate pad 22 are respectively illustrated as the rectangular planar shapes labeled S and G. In FIGS. 2 to 4, the anode pad 24, the cathode pad 25, an electrode pad 26 of the current sensor, and an electrode pad 27 of the overvoltage protection unit are respectively illustrated as the rectangular planar shapes labeled A, K, OC, and OV.

The arithmetic circuit is constituted by a plurality of semiconductor devices such as complementary MOS (CMOS) circuits. Therefore, the arithmetic circuit includes electrode pads other than the front surface electrodes (source electrodes and the like; not illustrated in the figures) of the plurality of semiconductor devices constituting the arithmetic circuit. If the arithmetic circuit is arranged on the same semiconductor substrate 10 as the MOSFET in the effective region 1a, the device structures (including the front surface electrodes) of the plurality of semiconductor devices constituting the arithmetic circuit should be arranged in the effective region 1a of the active region 1. The electrode pads of the arithmetic circuit may be arranged in the non-effective region 1b of the active region 1.

The edge termination region 2 is the region between the active region 1 and the edges (side faces) of the semiconductor substrate 10 and serves to reduce the electric field on the front surface side (relative to the semiconductor substrate 10) of an n$^-$ drift region 12 (described later; FIGS. 5, 6) as well as to maintain the breakdown voltage (withstand voltage). In the edge termination region 2, a voltage withstand structure (not illustrated in the figures) such as a field limiting ring (FLR), a mesa structure, a junction termination extension (JTE) structure, or a field plate is arranged. Here, "breakdown voltage" refers to a limit voltage that does not cause the device to exhibit an excessive increase in leakage current or to malfunction or be damaged.

Next, the cross-sectional structure of the MOSFET in the effective region 1a will be described. As illustrated in FIGS. 5 and 6, in the effective region 1a, trench-gate MOS gates are formed on the front surface side of the semiconductor substrate 10. The semiconductor substrate 10 is a silicon carbide epitaxial substrate (semiconductor chip) formed by epitaxially growing silicon carbide layers (first and second or lower and upper semiconductor layers) 51 and 52 (which will respectively become an n$^-$ drift region 12 and a p-type base region (third semiconductor region) 14) in order on the front surface of an n$^+$ starting substrate (bottom substrate) 11 made of silicon carbide. In the semiconductor substrate 10, the principal surface on the p-type silicon carbide layer 52 side (the front surface of the p-type silicon carbide layer 52) is the front surface (top surface), and the principal surface on the n$^+$ starting substrate 11 side (the rear surface of the n$^+$ starting substrate 11) is the rear surface (bottom surface).

Each MOS gate includes a p-type base region 14, an n$^+$ source region 15, a p$^{++}$ contact region 16, a trench 17, a gate insulating film 18, and a gate electrode 19. More specifically, the trenches 17 go from the front surface of the semiconductor substrate 10 through the p-type silicon carbide layer 52 (p-type base region 14) in a depth direction Z and reach the n$^-$ silicon carbide layer 51. The trenches 17, when viewed from the front side of the semiconductor substrate 10, may be arranged in stripe shapes extending in the first direction X or may be arranged in a matrix pattern, for example. Within each trench 17, a gate insulating film 18 and a gate electrode 19 are formed. Here, a single unit cell is constituted by the gate electrode 19 within a single trench 17 and the adjacent mesa regions (regions between adjacent trenches 17) sandwiching that gate electrode 19.

In the surface layer on the source side (n$^+$ source region 15 side) of the n$^-$ silicon carbide layer 51, an n-type region 13 is formed contacting the p-type silicon carbide layer 52. This n-type region 13 is a so-called current spreading layer (CSL) which reduces carrier spreading resistance. This n-type region (hereinafter, "n-type current spreading region") 13 is formed with uniform thickness in the directions parallel to the front surface of the semiconductor substrate 10 so as to reach both sidewalls of adjacent trenches 17 sandwiching the mesa regions. The n-type current spreading region 13 reaches from an interface with the p-type base region 14 to a position that is deeper towards the drain side (drain electrode (second electrode) 23 side) than the bottom surfaces of the trenches 17.

The portion of the n$^-$ silicon carbide layer 51 other than the n-type current spreading region 13 is the n$^-$ drift region 12. First and second p$^+$ regions (fourth and fifth semiconductor regions) 41 and 42 are respectively selectively formed within the n-type current spreading region 13. The first p$^+$ region 41 is arranged separated from the p-type base region 14 at a position that is deeper towards the drain side than the interface between the p-type base region 14 and the n-type current spreading region 13. Moreover, the first p$^+$ region 41 faces the bottom surface of the trench 17 in the depth direction Z. The first p$^+$ region 41 may be exposed at the bottom surface and bottom surface corners of the trench 17. Here, the "bottom surface corners" of the trench 17 refer to the boundaries between the bottom surface and sidewalls of the trench 17.

Between adjacent trenches 17, the second $p^+$ region 42 is formed separated from the first $p^+$ region 41 and the trenches 17 and contacting the center portion of the p-type base region 14, for example. p-n junctions between the first and second $p^+$ regions 41 and 42 and the n-type current spreading region 13 (or $n^-$ drift region 12) are formed at positions deeper towards the drain side than the bottom surfaces of the trenches 17. This makes it possible to prevent high electric fields from being applied to the gate insulating film 18 at the portions along the bottom surface of each trench 17. Also, the n-type current spreading region 13 may be omitted, and the first and second $p^+$ regions 41 and 42 may be formed within the $n^-$ drift region 12.

As long as the first and second $p^+$ regions 41 and 42 are arranged such that the p-n junctions between the first and second $p^+$ regions 41 and 42 and the n-type current spreading region 13 (or $n^-$ drift region 12) are formed at a position that is deeper towards the drain side than the bottom surfaces of the trenches 17, the depths of the first and second $p^+$ regions 41 and 42 towards the drain side can be modified in various ways according to the design requirements. For example, the first and second $p^+$ regions 41 and 42 may be terminated, further towards the drain side than the bottom surfaces of the trenches 17, either within the n-type current spreading region 13 or within the $n^-$ drift region 12, or may be terminated at the interface between the n-type current spreading region 13 and the $n^-$ drift region 12.

The $n^+$ source region 15 and the $p^{++}$ contact region 16 are respectively selectively formed within the p-type silicon carbide layer 52. The $n^+$ source region 15 contacts the gate insulating film 18 on the sidewalls of the trench 17 and faces the gate electrode 19 with the gate insulating film 18 on the sidewalls of the trench 17 interposed therebetween. The $p^{++}$ contact region 16 is formed nearer to the center side of the mesa region than the $n^+$ source region 15. The $p^{++}$ contact region 16 faces the second $p^+$ region 42 in the depth direction Z, for example. The portion of the p-type silicon carbide layer 52 other than the $n^+$ source region 15 and the $p^{++}$ contact region 16 is the p-type base region 14.

The p-type base region 14 extends from the effective region 1$a$ to the non-effective region 1$b$ and is terminated closer to the effective region 1$a$ side than the area of the non-effective region 1$b$ in which the electrode pads (in FIG. 5, the gate pad 22) are arranged. Below, the portion of the p-type base region 14 which extends into the non-effective region 1$b$ will be referred to as a "p-type base region extension 14'". Moreover, although here an example in which only the gate pad 22 is arranged in the non-effective region 1$b$ will be described, if electrode pads other than the gate pad 22 will also be arranged in the non-effective region 1$b$, the following description should be read with the term "gate pad 22" being replaced by the phrase "all of the electrode pads arranged in the non-effective region 1$b$".

No $n^+$ source region 15 is formed within the p-type base region extension 14'. A $p^{++}$ contact region 16 may be selectively formed within the p-type base region extension 14' similarly to in the p-type base region 14 in the mesa region. The p-type base region extension 14' surrounds the periphery of the non-effective region 1$b$. A width w2 of the p-type base region extension 14' is substantially equal to a width w1 of the mesa region, for example. Directly beneath (on the drain side of) the p-type base region extension 14', a second $p^+$ region 42' is formed similarly to the second $p^+$ region 42 directly beneath the p-type base region 14 in the mesa region.

The second $p^+$ region 42' directly beneath the p-type base region extension 14' faces, in the depth direction Z, a portion of the p-type base region extension 14' that is positioned at approximately half of the width w2 thereof. In other words, the second $p^+$ region 42' directly beneath the p-type base region extension 14' is arranged at a position that is separated further from the gate pad 22 than is a gate pad 22-side corner 14$a$' of the p-type base region extension 14'. Here, the "gate pad 22-side corner 14$a$' of the p-type base region extension 14'" refers to the boundary between the gate pad 22-side face and drain-side face of the p-type base region extension 14'.

An interlayer insulating film 20 is formed over the entire front surface of the semiconductor substrate 10 so as to cover the gate electrodes 19. In this interlayer insulating film 20, a plurality of contact holes are formed going through the interlayer insulating film 20 in the depth direction Z. All of the gate electrodes 19 are electrically connected to the gate pad 22 via these contact holes (not illustrated in the figures) in the interlayer insulating film 20. A source electrode also serves as the source pad 21. In the following description, this source electrode is described as being the source pad 21.

The source pad 21 is connected to the $n^+$ source region 15 and the $p^{++}$ contact region 16 within contact holes 20$a$ in the interlayer insulating film 20 and is electrically connected to the p-type base region 14 via the $n^+$ source region 15 and the $p^{++}$ contact region 16. Moreover, the source pad 21 is connected to the p-type base region extension 14' within a contact hole 20$b$ that is formed closest to the non-effective region 2$b$ side in the interlayer insulating film 20.

The source pad 21 has a layered structure in which a titanium (Ti) film 33, a second titanium nitride (TiN) film 34, and an aluminum (Al) alloy film 35 are layered in order on top of a first TiN film 31 and a nickel silicide (NiSi) film 32, for example. The first TiN film 31 only covers the front surface of the interlayer insulating film 20. The NiSi film 32 is only formed on the front surface of the semiconductor substrate 10 exposed by the contact holes 20$a$ and makes ohmic contact with the semiconductor substrate 10. The Ti film 33 covers the first TiN film 31 and the NiSi film 32. The second TiN film 34 is formed on top of the Ti film 33.

The Al alloy film 35 is formed on top of the second TiN film 34 so as to fill in the contact holes 20$a$. The first TiN film 31, the Ti film 33, and the second TiN film 34 are barrier metals which prevent interaction between the Al alloy film 35 and the semiconductor substrate 10. The Al alloy film 35 is a metal film made primarily of aluminum and may be an aluminum-silicon (Al—Si) film, an aluminum-silicon-copper (Al—Si—Cu) film, or an aluminum-copper (Al—Cu) film, for example. An aluminum film may be formed in place of the Al alloy film 35.

One end of a terminal pin 37 is solder-bonded to a plating film 36 such that the terminal pin 37 stands up substantially orthogonally to the front surface of the semiconductor substrate 10. The other end of the terminal pin 37 is bonded to a metal bar (not illustrated in the figures) arranged facing the front surface of the semiconductor substrate 10 and is exposed on the outer side of a case (not illustrated in the figures) in which the semiconductor substrate 10 is packaged in order to be electrically connected to an external device (not illustrated in the figures). The terminal pin 37 is an external connection terminal for extracting the voltage of the source pad 21 to outside of the device, for example. The terminal pin 37 is a circular rod-shaped (cylinder-shaped)

wire of a prescribed diameter. A first protective film 38 is a passivation film which covers the portions of the surface of the source pad 21 other than the plating film 36. A second protective film 39 is a passivation film which covers the boundary between the plating film 36 and the first protective film 38.

A drain electrode 23 makes ohmic contact with the rear surface of the semiconductor substrate 10 (the rear surface of the n⁺ starting substrate 11, which is an n⁺ drain region). The drain electrode 23 also serves as a drain pad. The drain electrode 23 is solder-bonded to a metal base plate (not illustrated in the figures) and contacts at least one portion of a base section of cooling fins (not illustrated in the figures) via this metal base plate. Thus, a dual-surface cooling structure is formed, and heat generated by the semiconductor substrate 10 is radiated from fin portions of the cooling fins that contact the rear surface of the semiconductor substrate 10 via the metal base plate and is also radiated from the metal bar bonded to the terminal pin 37 on the front surface of the semiconductor substrate 10.

Next, the structure of the non-effective region 1b will be described. As illustrated in FIG. 5, in the non-effective region 1b, the gate pad 22 is formed on the front surface of the semiconductor substrate 10 with the interlayer insulating film 20 interposed therebetween. Furthermore, in the non-effective region 1b, the anode pad 24, the cathode pad 25, the current sensor electrode pad 26, and the overvoltage protection unit electrode pad 27 may also be formed on the front surface of the semiconductor substrate 10 with the interlayer insulating film 20 interposed therebetween (see FIGS. 2 to 4). Although this is not illustrated in the figures, similar to with the source pad 21, a pin structure constituted by a plating film 36, a solder layer, a terminal pin 37, and first and second protective films 38 and 39 is formed for each of these electrode pads in the non-effective region 1b.

No MOSFET unit cells are formed in the non-effective region 1b. In the non-effective region 1b, the surface layer of the front surface of the semiconductor substrate 10 is an n-type region (second semiconductor region; also referred to as "continuous region of the n-type or the first conductivity type) 13'. This n-type region 13' faces the gate pad 22 in the depth direction Z with the interlayer insulating film 20 sandwiched therebetween. Moreover, the n-type region 13' is formed spanning across the entire non-effective region 1b and contacts the p-type base region extension 14' and the second p⁺ region 42' directly beneath the p-type base region extension 14'. In other words, the portion of the semiconductor substrate 10 in the non-effective region 1b is only an n-type region constituted by the n⁺ starting substrate 11, the n⁻ drift region 12, and the n-type region 13', with the interlayer insulating film 20 sandwiched thereabove.

The n-type region 13' may reach to substantially the same depth from the front surface of the semiconductor substrate 10 in the depth direction Z as the n-type current spreading region 13, for example. The periphery of the n-type region 13' is surrounded by the p-type base region extension 14' and the second p⁺ region 42' directly beneath the p-type base region extension 14'. It is preferable that the impurity concentration of the n-type region 13' be higher than the impurity concentration of the n⁻ drift region 12, and the impurity concentration of the n-type region 13' may be approximately equal to the impurity concentration of the n-type current spreading region 13, for example. More specifically, the impurity concentration of the n-type region 13' may be approximately $1 \times 10^{14}/cm^3$ to $1 \times 10^{15}/cm^3$, for example.

Next, the structure of an SBD to be used for the SBDs 121 to 124 of the inverter illustrated in FIG. 18 will be described with reference to FIG. 7. The semiconductor device illustrated in FIG. 7 is an SiC SBD formed in a semiconductor substrate (second semiconductor substrate (semiconductor chip)) 60 made of silicon carbide. The semiconductor substrate 60 in which the SiC SBD illustrated in FIG. 7 is formed is different from the semiconductor substrate 10 in which the SiC MOSFET illustrated in FIG. 1 is formed. The SiC SBD illustrated in FIG. 7 is connected in anti-parallel to the SiC MOSFET illustrated in FIG. 1.

The semiconductor substrate 60 is a silicon carbide epitaxial substrate formed by epitaxially growing an n⁻ silicon carbide layer which will become an n⁻ drift region 62 on the front surface of an n⁺ starting substrate 61 made of silicon carbide. In the semiconductor substrate 60, the principal surface on the n⁻ drift region 62 side (the front surface of the n⁻ drift region 62) is the front surface (third principal surface), and the principal surface on the n⁺ starting substrate 61 side (the rear surface of the n⁺ starting substrate 61) is the rear surface (fourth principal surface). The front surface of the semiconductor substrate 60 may be the (0001) plane (the so-called Si plane) or may be the (000-1) plane (the so-called c-plane), for example.

In an active region 81, a plurality of p-type regions (seventh semiconductor regions) 63 for a junction-barrier Schottky (JBS) structure are selectively formed separated from one another in the surface layer of the front surface of the semiconductor substrate 60. The plurality of p-type regions 63 for the JBS are arranged in a concentric circle pattern. A width w11 of portions of the n⁻ drift region 62 that are sandwiched between adjacent p-type regions 63 is at most approximately 3 μm, for example. A width w12 of the p-type regions 63 for the JBS is approximately 2 μm, for example.

Near the boundary between the active region 81 and an edge termination region 82 that surrounds the periphery of the active region 81, a p-type region 64 for a junction termination extension (JTE) structure is selectively formed in the surface layer of the front surface of the semiconductor substrate 60. The p-type region 64 for the JTE is arranged separated from the p-type regions 63 for the JBS and surrounds the periphery of the active region 81. The impurity concentration of the p-type region 64 for the JTE is less than the impurity concentration of the p-type regions 63 for the JBS.

In the edge termination region 82, a plurality of floating-voltage p-type regions 65 for a field limiting ring (FLR) are selectively formed separated from one another in the surface layer of the front surface of the semiconductor substrate 60. The plurality of p-type regions 65 for the FLR are arranged further outwards (towards the edge side of the semiconductor substrate 60) than the p-type region 64 for the JTE and are separated from the p-type region 64 for the JTE. The plurality of p-type regions 65 for the FLR are arranged in a concentric circle pattern surrounding the periphery of the p-type region 64 for the JTE. The p-type region 64 for the JTE and the plurality of p-type regions 65 for the FLR are arranged such that the electric field distribution within the semiconductor substrate 60 is uniformly spaced near the corners of a Schottky electrode (third electrode/upper electrode) 68 which will be described later.

Moreover, in the edge termination region 82, an n-type channel stopper region 66 is selectively formed in the surface layer of the front surface of the semiconductor substrate 60. The n-type channel stopper region 66 is arranged further outwards than the p-type regions 65 for the FLR, is separated from the p-type regions 65 for the FLR, and surrounds the periphery of the p-type regions 65 for the FLR. The portion of the n⁻ silicon carbide layer of the semiconductor substrate 60 other than the p-type regions 63 to 66 is the n⁻ drift region 62. In an interlayer insulating film 67, which covers the entire front surface of the semiconductor substrate 60, a contact hole 60a is formed going through the interlayer insulating film 67 in a depth direction Z.

Inside this contact hole 60a, the entire front surface of the semiconductor substrate 60 in the active region 81 and the inner edges (near the center side of the semiconductor substrate 60) of the p-type region 64 for the JTE are exposed. A Schottky electrode 68 which makes Schottky contact with the p-type regions 63 for the JBS is formed over the entire front surface of the semiconductor substrate 60 within the contact hole 60a. The Schottky electrode 68 also contacts the edges of the p-type region 64 for the JTE within the contact hole 60a.

The Schottky electrode 68 has a substantially square planar shape with the vertices rounded to a curvature of 150 μm, for example. This makes it possible to reduce electric field concentration at the corners of the Schottky electrode 68 corresponding to the vertices of the substantially square planar shape. The Schottky electrode 68 overlaps with the edges of the p-type region 64 for the JTE by a width of approximately 4 μm, for example. The material for the Schottky electrode 68 may be titanium (Ti), for example, or may be another material that makes Schottky contact with the semiconductor substrate 60.

Arranging the p-type regions 63 for the JBS, the p-type region 64 for the JTE, the plurality of p-type regions 65 for the FLR, the n-type channel stopper region 66, and the Schottky electrode 68 in the manner described above reduces leakage current and on-resistance. A Schottky electrode pad 69 is formed on top of the Schottky electrode 68. The Schottky electrode pad 69 may extend onto the interlayer insulating film 67.

One end of a terminal pin 71 is connected to the Schottky electrode pad 69 via a plating film 70. The other end of the terminal pin 71 is bonded to a metal bar (not illustrated in the figure) arranged facing the front surface of the semiconductor substrate 60 and is exposed on the outer side of a case (not illustrated in the figure) in which the semiconductor substrate 60 is packaged in order to be electrically connected to an external device (not illustrated in the figure). The terminal pin 71 is an external connection terminal for extracting the voltage of the Schottky electrode 68 to outside of the device, for example. The terminal pin 71 is a circular rod-shaped (cylinder-shaped) wire of a prescribed diameter.

A first protective film 72 is a passivation film which covers the portions of the surface of the Schottky electrode pad 69 other than the plating film 70. A second protective film 73 is a passivation film which covers the boundary between the plating film 70 and the first protective film 72. In other words, the SiC SBD illustrated in FIG. 7 has the same pin structure as the MOSFET in the effective region 1a of the semiconductor substrate 10. On the rear surface of the semiconductor substrate 60 (the rear surface of the n⁺ starting substrate 61, which is an n⁺ cathode region), an ohmic electrode (fourth electrode) 74 is formed in ohmic contact with the semiconductor substrate 60.

The SiC SBD illustrated in FIG. 7 is connected in anti-parallel to the SiC MOSFET illustrated in FIGS. 1, 5, and 6. In other words, the Schottky electrode 68 of the SiC SBD is electrically connected to the source electrode 21 of the SiC MOSFET via the Schottky electrode pad 69, the plating film 70, and the terminal pin 71. The ohmic electrode 74 of the SiC SBD is electrically connected to the drain electrode 23 of the SiC MOSFET.

Next, the operation of the semiconductor device according to Embodiment 1 and illustrated in FIGS. 1, 5, and 6 will be described. In a state in which a positive voltage (source-drain voltage) relative to the source electrode (source pad 21) is applied to the drain electrode 23, a gate voltage Vg that is less than the gate threshold voltage Vth is applied to the gate electrodes 19. When this happens, the p-n junction between the p-type base region 14 and the n⁻ drift region 12 as well as the p-n junctions between the first and second p⁺ regions 41 and 42, p-type base region 14, and p⁺⁺ contact region 16 and the n⁻ drift region 12 are reverse-biased, and therefore the reverse breakdown voltage of the active region 1 is maintained and no current flows. In other words, the MOSFET remains in the OFF state.

Meanwhile, if, in a state in which a source-drain voltage is applied, a gate voltage Vg that is greater than or equal to the gate threshold voltage Vth is applied to the gate electrodes 19, an n-type inversion layer (channel) forms in the portion of the p-type base region 14 sandwiched between the n⁺ source region 15 and the n⁻ drift region 12 and running along the trenches 17. As a result, current flows along a path including the n⁺ starting substrate 11, the n⁻ drift region 12, the n-type current spreading region 13, the surface inversion layer of the p-type base region 14, and the n⁺ source region 15, and the MOSFET takes the ON state. In this way, the MOSFET can be switched ON and OFF by controlling the gate voltage Vg applied to the gate electrodes 19 of the MOSFET.

Moreover, while the MOSFET is OFF, applying a positive voltage to the source electrode (source pad 21) and applying a negative voltage to the drain electrode 23 causes a parasitic diode 44 formed by the p-n junctions between the first and second p⁺ regions 41 and 42, p-type base region 14, and p⁺⁺ contact region 16 and the n⁻ drift region 12 and n⁺ starting substrate 11 to be forward-biased. However, in the present invention this parasitic diode 44 does not conduct any current. This is because due to the absence of a p-type region directly beneath the gate pad 22, no parasitic diode is formed in the non-effective region 1b, which makes it possible to increase the forward voltage applied to the parasitic diode.

When the MOSFET illustrated in FIGS. 1, 5, and 6 is used for the MOSFETs 101 to 104 in FIG. 18 to make the inverter perform a commutation operation, parasitic diodes 111 to 114 of the MOSFETs 101 to 104 do not conduct current even during the transient period in which the MOSFETs 101 to 104 are switched from ON to OFF. Therefore, the transient current flows through the external SBDs 121 to 124 respectively connected in anti-parallel to the MOSFETs 101 to 104 and does not flow through the parasitic diodes of the MOSFETs 101 to 104. Due to the fact that no transient current flows through the parasitic diodes of the MOSFETs 101 to 104, no minority carriers (holes) are injected into the n⁻ drift region 12 from the p-type base region 14, which makes it possible to prevent crystal defects from developing in the semiconductor substrate 10 due to recombination of minority carriers.

Figure 8:
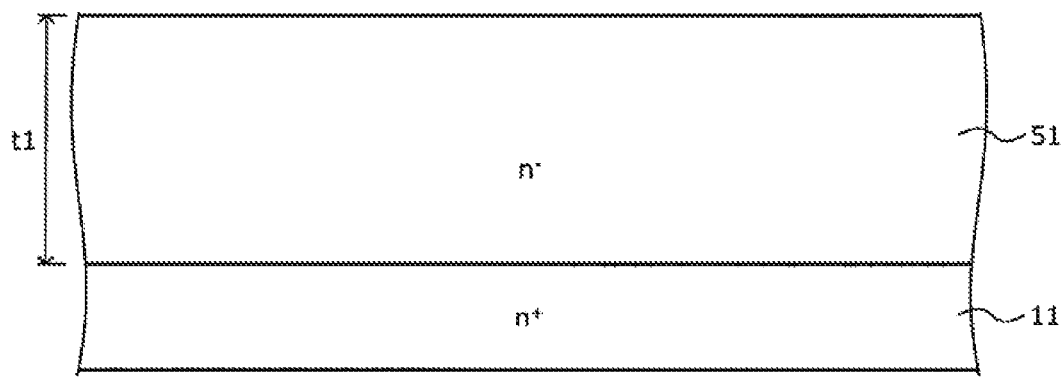
FIG. 8 is a cross-sectional view illustrating a state during manufacture of the semiconductor device according to Embodiment 1.
Figure 9:
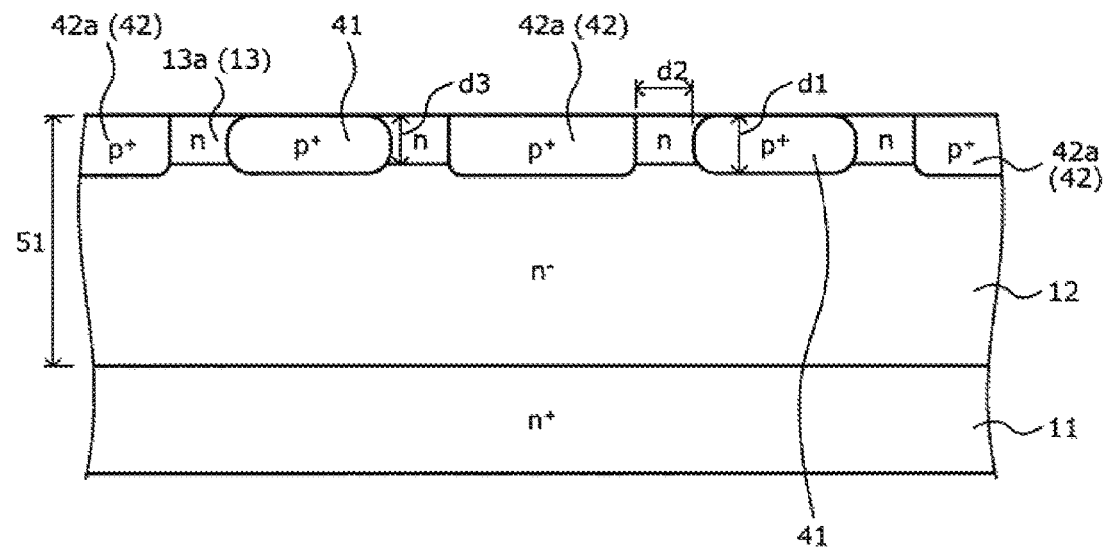
FIG. 9 is a cross-sectional view illustrating a state during manufacture of the semiconductor device according to Embodiment 1.

Next, a method of manufacturing the semiconductor device according to Embodiment 1 and illustrated in FIGS. 1, 5, and 6 will be described. FIGS. 8 to 13 are cross-sectional views illustrating states during manufacture of the semiconductor device according to Embodiment 1. FIGS. 8 to 13 illustrate states during manufacture of the MOSFET in the effective region 1a (see FIG. 6). The states of the non-effective region 1b will be described with reference to FIG. 5. First, as illustrated in FIG. 8, an n⁺ starting substrate (semiconductor wafer) 11 made of silicon carbide is prepared.

The n⁺ starting substrate 11 may be a monocrystalline silicon carbide substrate doped with nitrogen (N), for example. The front surface of the n⁺ starting substrate 11 may be the (0001) plane (the so-called Si plane), for example. Next, an n⁻ silicon carbide layer 51 doped with nitrogen (N) to a lower concentration than the n⁺ starting substrate 11 is epitaxially grown on the front surface of the n⁺ starting substrate 11. The thickness t1 of the n⁻ silicon carbide layer 51 may be approximately 30 µm, for example.

Next, using photolithography and a process of ion-implanting p-type impurities such as aluminum, for example, a first p⁺ region 41 and a p⁺ region (hereinafter, "p⁺ partial region") 42a are respectively selectively formed in the surface layer of the n⁻ silicon carbide layer 51. This p⁺ partial region 42a is part of a second p⁺ region 42. The first p⁺ region 41 and the p⁺ partial region 42a are arranged repeating in an alternating manner in a direction parallel to the front surface of the n⁺ starting substrate 11.

The depth d1 and impurity concentration for both the first p⁺ regions 41 and the p⁺ partial regions 42a may respectively be approximately 0.5 µm and approximately $5.0 \times 10^{18}$/cm³, for example. The distance d2 between adjacent first p⁺ regions 41 and p⁺ partial regions 42a may be approximately 1.5 µm, for example. Then, the ion implantation mask used to form the first p⁺ regions 41 and the p⁺ partial regions 42a is removed.

Next, using photolithography and a process of ion-implanting n-type impurities such as nitrogen, for example, an n-type region (hereinafter, "n-type partial region") 13a is formed, spanning across an entire active region 1, for example, in the surface layer of the n⁻ silicon carbide layer 51. This n-type partial region 13a is part of an n-type current spreading region 13 in the effective region 1a and is part of an n-type region 13' in a non-effective region 1b (FIG. 5). The impurity concentration of the n-type partial region 13a may be approximately $1.0 \times 10^{17}$/cm³, for example.

Then, the ion implantation mask used to form the n-type partial region 13a is removed. The order in which the n-type partial region 13a and the first p⁺ regions 41 and p⁺ partial regions 42a are formed may be reversed. The portion of the n⁻ silicon carbide layer 51 that is further on the drain side than the n-type partial region 13a becomes an n⁻ drift region 12. Here, the depths (from the front surface of the semiconductor substrate 10) of the first and second p⁺ regions 41 and 42 relative to the n-type current spreading region 13 are determined by altering a depth d3 of the n-type partial region 13a in various ways.

For example, when making the depth d3 of the n-type partial region 13a be less than the depth d1 of the first p⁺ regions 41 and the p⁺ partial regions 42a (FIG. 9), the depth of the n-type partial region 13a may be approximately 0.4 µm, for example. Moreover, when making the depth d3 of the n-type partial region 13a be greater than the depth d1 of the first p⁺ regions 41 and the p⁺ partial regions 42a, the first p⁺ regions 41 and the p⁺ partial regions 42a may be entirely covered by the n-type partial region 13a.

Figure 10:
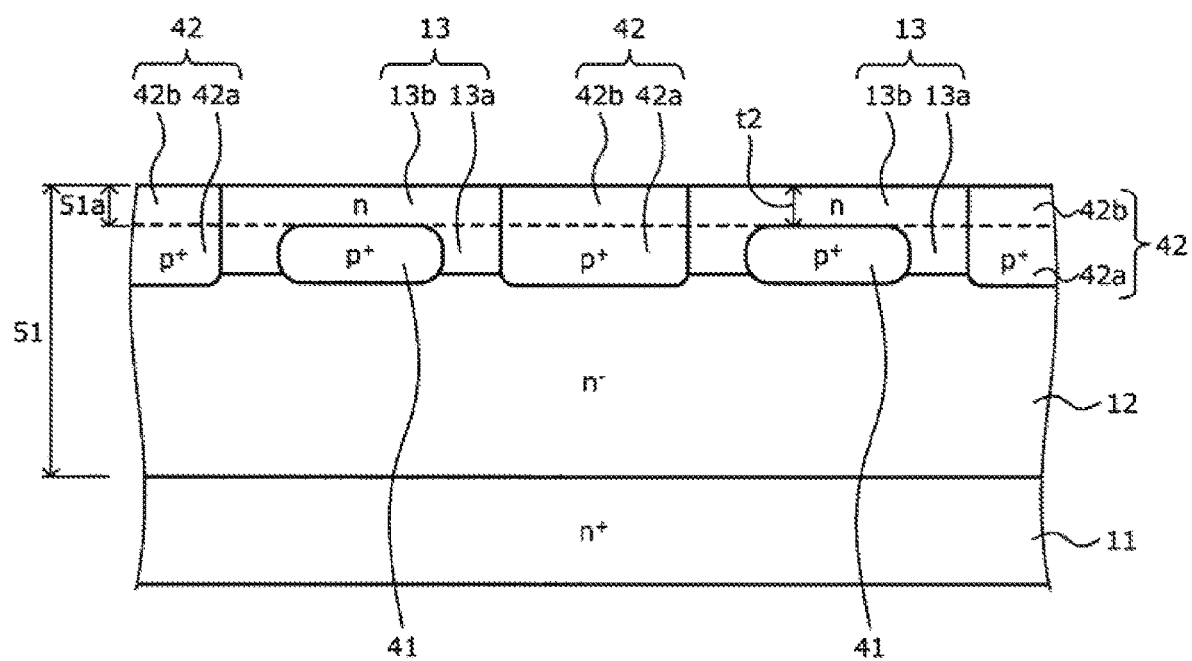
FIG. 10 is a cross-sectional view illustrating a state during manufacture of the semiconductor device according to Embodiment 1.

Next, as illustrated in FIG. 10, another n⁻ silicon carbide layer doped with n-type impurities such as nitrogen, for example, is epitaxially grown to a thickness t2 of 0.5 µm, for example, on the n⁻ silicon carbide layer 51 in order to increase the thickness of the n⁻ silicon carbide layer 51. The n⁻ silicon carbide layer 51 may have a uniform impurity concentration of approximately $3.0 \times 10^{15}$/cm³, for example, going from the portion 51a in which thickness was increased (the surface layer of the n⁻ silicon carbide layer 51) to the interface with the n⁺ starting substrate 11 in the depth direction.

Next, using photolithography and a process of ion-implanting p-type impurities such as aluminum, p⁺ partial regions 42b of a depth that reaches the p⁺ partial regions 42a are selectively formed in sections of the portion 51a in which the thickness of the n⁻ silicon carbide layer 51 was increased that face the p⁺ partial regions 42a in the depth direction. The width and impurity concentration of the p⁺ partial regions 42b are substantially equal to those of the p⁺ partial regions 42a, for example. The p⁺ partial regions 42a and 42b are connected in the depth direction Z to form the second p⁺ regions 42. Then, the ion implantation mask used to form the p⁺ partial regions 42b is removed.

Next, using photolithography and a process of ion-implanting n-type impurities such as nitrogen, for example, an n-type partial region 13b of a depth that reaches the n-type partial region 13a is formed, spanning across the entire active region 1, for example, in the portion 51a in which the thickness of the n⁻ silicon carbide layer 51 was increased. The impurity concentration of the n-type partial region 13b is substantially equal to that of the n-type partial region 13a. The n-type partial regions 13a and 13b are connected in the depth direction Z to form the n-type current spreading region 13 in the effective region 1a and to increase the thickness of an n-type partial region that becomes part of the n-type region 13' in the non-effective region 1b. Then, the ion implantation mask used to form the n-type partial region 13b is removed. The order in which the p⁺ partial regions 42b and the n-type partial region 13b are formed may be reversed.

Figure 11:
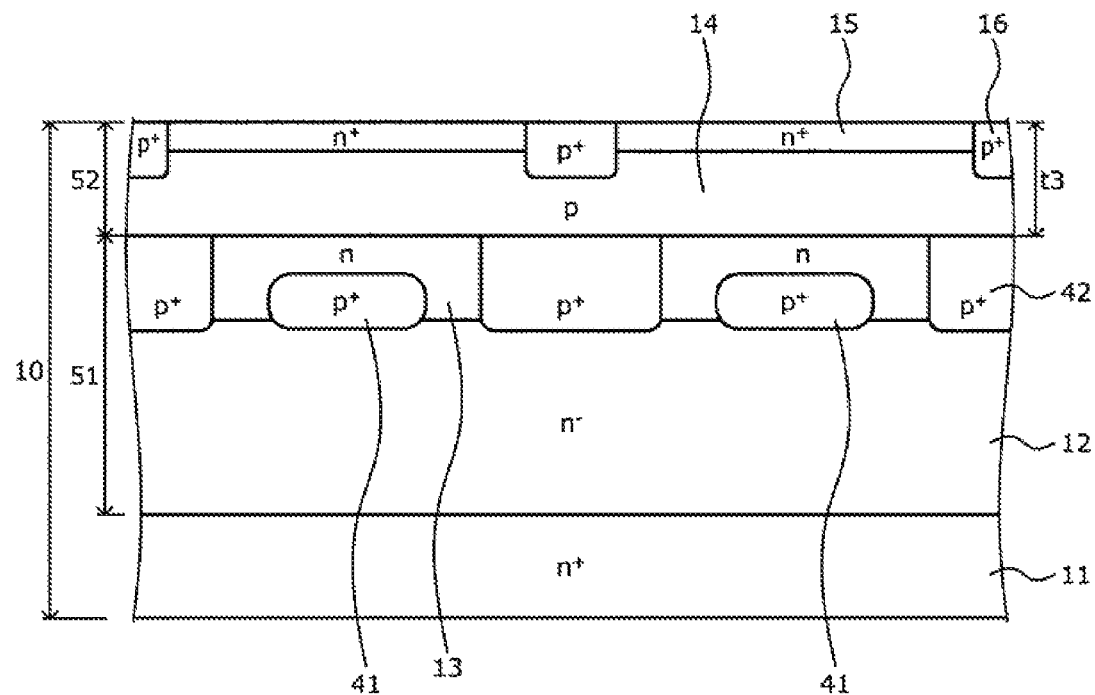
FIG. 11 is a cross-sectional view illustrating a state during manufacture of the semiconductor device according to Embodiment 1.

Next, as illustrated in FIG. 11, a p-type silicon carbide layer 52 doped with p-type impurities such as aluminum, for example, is epitaxially grown on the n⁻ silicon carbide layer 51. The thickness t3 and impurity concentration of the p-type silicon carbide layer 52 may respectively be approximately 1.3 µm and approximately $4.0 \times 10^{17}$/cm³, for example. In this way, a semiconductor substrate (semiconductor wafer) 10 in which the n⁻ silicon carbide layer 51 and the p-type silicon carbide layer 52 are deposited in order on the n⁺ starting substrate 11 is formed.

Next, using photolithography and a process of ion-implanting n-type impurities such as phosphorus (P), for example, n⁺ source regions 15 are selectively formed in the surface layer of the p-type silicon carbide layer 52. Then, the ion implantation mask used to form the n⁺ source regions 15 is removed. Next, using photolithography and a process of ion-implanting p-type impurities such as aluminum, p⁺⁺ contact regions 16 are selectively formed in the surface layer of the p-type silicon carbide layer 52. Then, the ion implantation mask used to form the p⁺⁺ contact regions 16 is removed.

The order in which the n⁺ source regions 15 and the p⁺⁺ contact regions 16 are formed may be reversed. The portion of the p-type silicon carbide layer 52 other than the n⁺ source regions 15 and the p⁺⁺ contact regions 16 becomes a p-type base region 14. The portion of the p-type base region 14 that is positioned in a formation region for the non-effective region 1b becomes a p-type base region extension 14'. Although in each of the ion implantation processes described above a resist film was described as being used as the ion implantation mask as an example, an oxide film which has been partially removed using such a resist film as a mask may be used in place of the resist film.

Next, using photolithography and a process of ion-implanting n-type impurities such as phosphorus, for example, the p-type silicon carbide layer 52 is inverted to n-type to form an n-type partial region of a depth that reaches the n-type partial region 13b spanning across the entire non-effective region 1b of the active region 1. The impurity concentration of this n-type partial region is substantially equal to that of the n-type partial region 13a. The n-type partial regions formed in the silicon carbide layers 51 and 52 in the non-effective region 1b are connected in the depth direction Z to make the portion of the semiconductor substrate 10 in the non-effective region 1b be only an n-type region constituted by the n$^+$ starting substrate 11, the n$^-$ drift region 12, and the n-type region 13' (FIG. 5).

Then, the ion implantation mask used to form the n-type partial region in the non-effective region 1b is removed. Next, a heat treatment (activation annealing) is performed for approximately 2 minutes at a temperature of approximately 1700° C., for example, to activate the impurities in all of the diffusion regions formed using ion implantation (the first and second p$^+$ regions 41 and 42, the n-type current spreading region 13, the n-type region 13', the n$^+$ source regions 15, and the p$^{++}$ contact regions 16). The activation annealing may be performed a single time after all of the diffusion regions have been formed or may be performed each time a diffusion region is formed using ion implantation.

Figure 12:
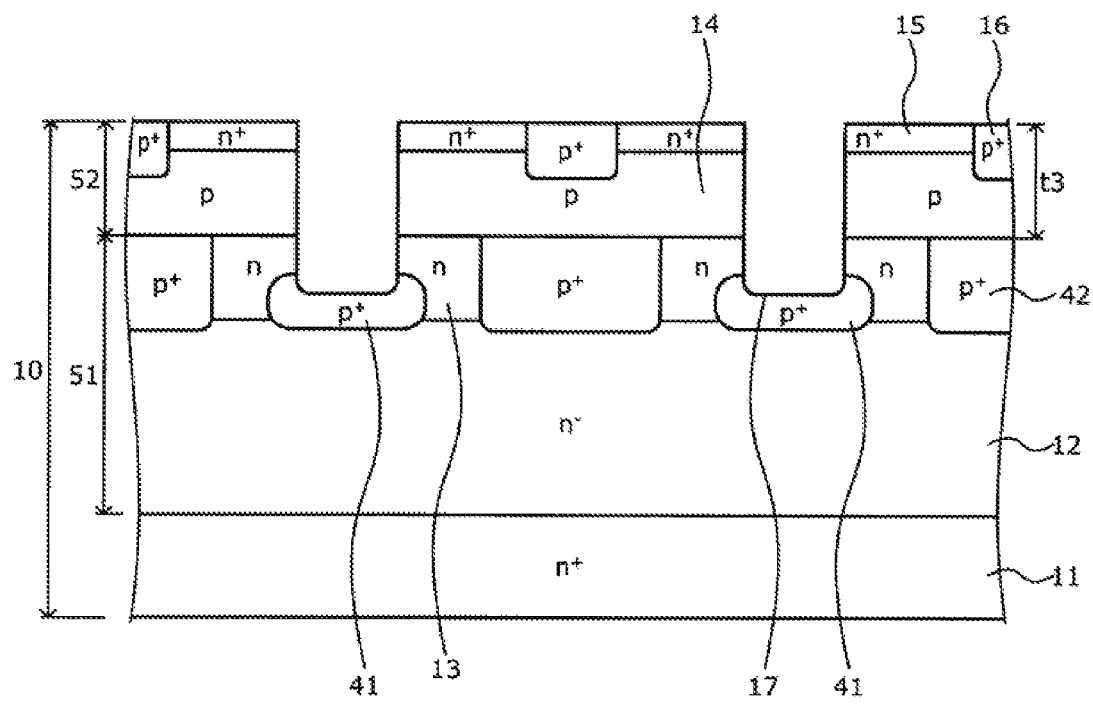
FIG. 12 is a cross-sectional view illustrating a state during manufacture of the semiconductor device according to Embodiment 1.

Next, as illustrated in FIG. 12, using photolithography and etching, trenches 17 are formed going through the n$^+$ source regions 15 and the p-type base region 14 and reaching the first p$^+$ regions 41 in the n-type current spreading region 13. A resist film or oxide film may be used as an etching mask for forming the trenches 17, for example. Then, the etching mask used to form the trenches 17 is removed.

Figure 13:
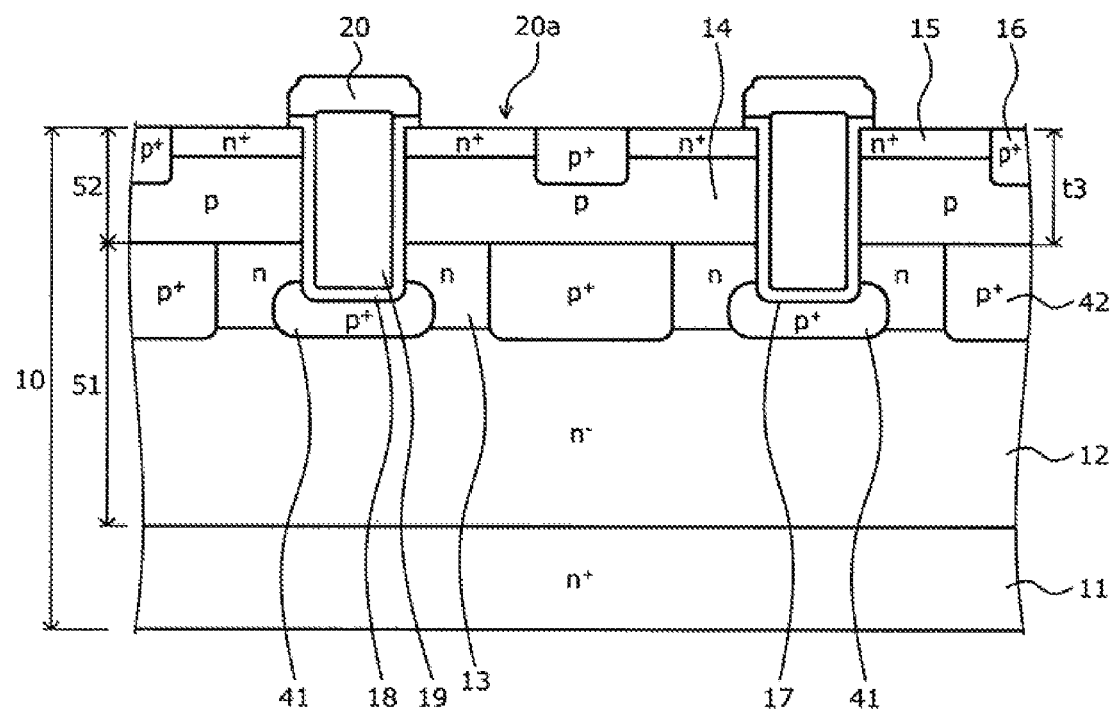
FIG. 13 is a cross-sectional view illustrating a state during manufacture of the semiconductor device according to Embodiment 1.

Next, as illustrated in FIG. 13, an oxide film which will become a gate insulating film 18 is formed on the surface of the semiconductor substrate 10 and along the inner walls of the trenches 17. The gate insulating film 18 may be formed by thermally oxidizing the surface of the semiconductor substrate 10 and the inner walls of the trenches 17 using a heat treatment performed at a temperature of approximately 1000° C. in an oxygen (O$_2$) atmosphere, for example. Alternatively, the gate insulating film 18 may be a film deposited using a high temperature oxidation (HTO) chemical reaction.

Next, a polysilicon (poly-Si) layer doped with phosphorus, for example, is deposited on the gate insulating film 18 so as to fill in the trenches 17. Then, the polysilicon layer is patterned to leave portions that will become gate electrodes 19 remaining within the trenches 17. At this time, the polysilicon layer may be left protruding outwards from the front surface of the semiconductor substrate 10, or using etching, the polysilicon layer may be etched so as to be left remaining further inwards than the substrate front surface.

Next, an interlayer insulating film 20 with a thickness of approximately 1 µm, for example, is formed over the entire front surface of the semiconductor substrate 10 so as to cover the gate insulating film 18 and the gate electrodes 19. The interlayer insulating film 20 may be phosphosilicate glass (PSG), for example. Then, the interlayer insulating film 20 and the gate insulating film 18 are patterned to form contact holes 20a and 20b, thereby exposing the n$^+$ source regions 15, the p$^{++}$ contact regions 16, and the p-type base region extension 14'. Next, the interlayer insulating film 20 is planarized using a heat treatment (reflow).

Then, after forming a first TiN film 31 covering the interlayer insulating film 20, the first TiN film 31 is partially removed using photolithography and etching so as to be left covering the surface of the interlayer insulating film 20.

Next, using a heat treatment performed at a temperature of approximately 970° C., for example, an NiSi film 32 that makes ohmic contact with the semiconductor substrate 10 is formed on the front surface of the semiconductor substrate 10 exposed by the contact holes 20a and 20b. Furthermore, on the entire rear surface of the semiconductor substrate 10, an NiSi film which will become a drain electrode 23 is formed in ohmic contact with the semiconductor substrate 10.

Next, using sputtering, for example, a Ti film 33 is formed along the front surface of the semiconductor substrate 10 so as to cover the first TiN film 31 and the NiSi film 32. Then, using sputtering, for example, a second TiN film 34 is formed on the Ti film 33 along the front surface of the semiconductor substrate 10. Next, using sputtering, for example, an Al alloy film 35 is formed on the second TiN film 34 so as to fill in the contact holes 20a. The thickness of the Al alloy film 35 may be approximately 5 µm, for example.

Next, using photolithography and etching, the Ti film 33, the second TiN film 34, and the Al alloy film 35 are patterned so as to be left remaining as a source pad 21 in the effective region 1a of the active region 1 and so as to be left remaining as a gate pad 22 in the non-effective region 1b of the active region 1. In this way, the source pad 21 and the gate pad 22, which are constituted by the first TiN film 31, the NiSi film 32, the Ti film 33, the second TiN film 34, and the Al alloy film 35, are formed separated from one another (see FIG. 5).

Next, using sputtering, for example, a Ti film, an Ni film, and a gold (Au) film, for example, are deposited in order on the NiSi film on the rear surface of the semiconductor substrate 10 as the drain electrode 23. Then, a first protective film 38 is formed covering the source pad 21 and the gate pad 22. Using photolithography and etching, this protective film 38 is then selectively removed to form openings in portions corresponding to bonding regions for terminal pins 37. Then, the etching mask used to form the first protective film 38 is removed.

Next, using a conventional plating process, a plating film 36 is formed on the portions of the source pad 21 and the gate pad 22 that are exposed by the openings in the first protective film 38. Here, the first protective film 38 functions as a mask that inhibits wetting and spreading of the plating film 36. The thickness of the plating film 36 may be approximately 5 µm, for example. Then, a second protective film 39 is formed covering the boundary between the plating film 36 and the first protective film 38.

Next, terminal pins 37 are solder-bonded to the plating film 36 using a solder layer (not illustrated in the figures). Here, the second protective film 39 functions as a mask that inhibits wetting and spreading of the solder layer. Finally, the semiconductor substrate 10 is diced (cut) into individual chips, thereby completing the MOSFET illustrated in FIGS. 1, 5, and 6.

Working Examples

Figure 14:
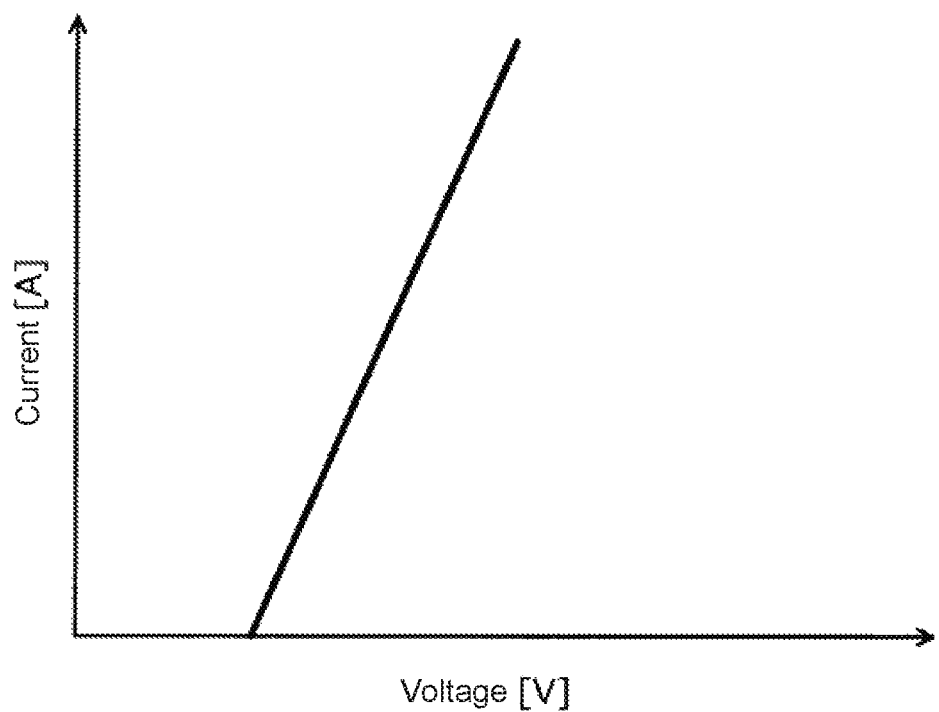
FIG. 14 is a graph showing the voltage-current characteristics of a semiconductor device according to a working example.
Figure 15:
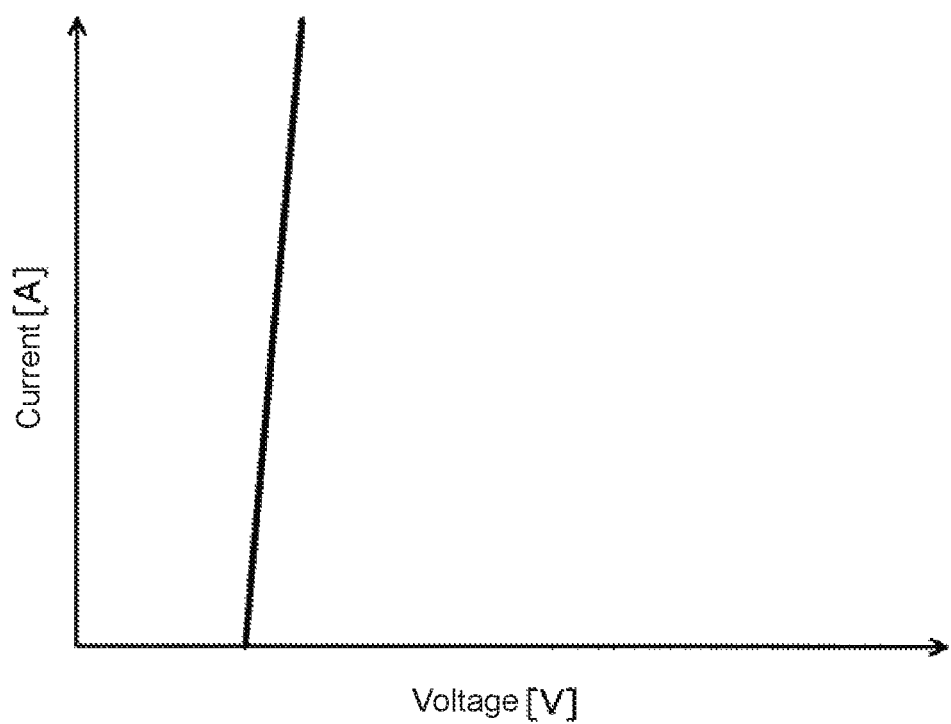
FIG. 15 is a graph showing the voltage-current characteristics of a conventional semiconductor device.
Figure 19:
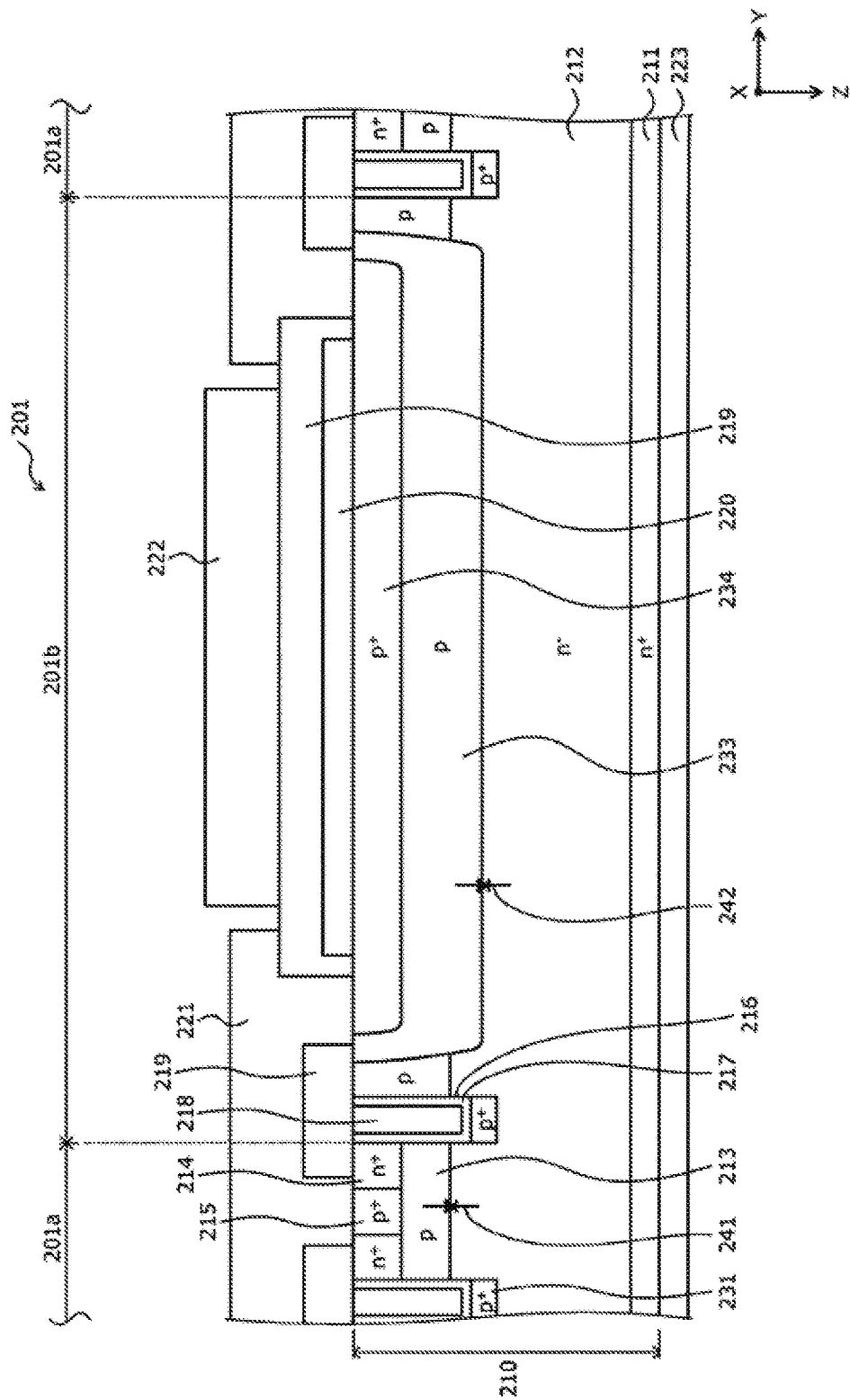
FIG. 19 is a cross-sectional view illustrating the structure of a conventional semiconductor device.
Figure 20:
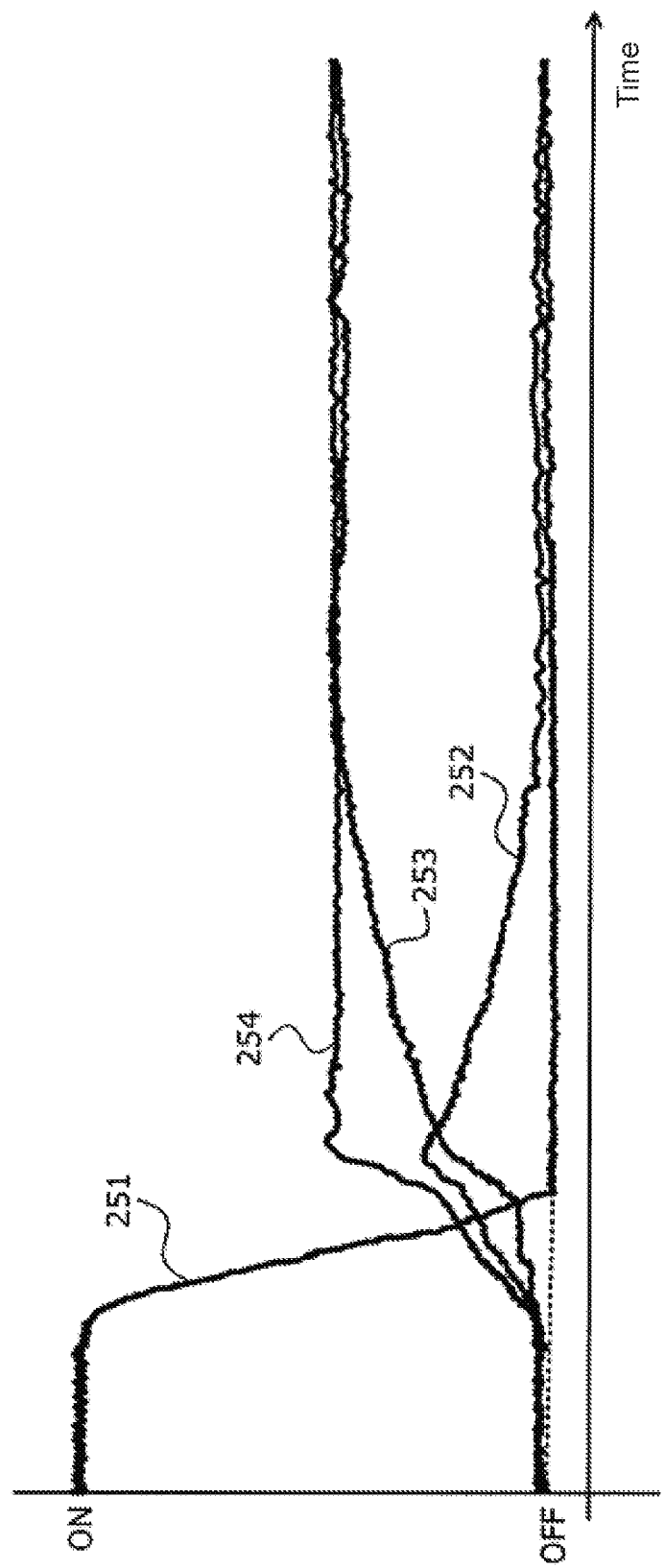
FIG. 20 is a graph showing the current waveforms of transient currents that, when an inverter performs a commutation operation, respectively flow through SBDs (through which commutation current flows) and parasitic diodes of MOSFETs to which those SBDs are reverse-connected.

Next, tests related to the forward voltage of the parasitic diode 44 of the semiconductor device according to Embodiment 1 were performed. FIG. 14 is a graph showing the voltage-current characteristics of a semiconductor device according to a working example. FIG. 15 is a graph showing the voltage-current characteristics of a conventional semiconductor device. First, a MOSFET having the structure of the semiconductor device according to Embodiment 1 as described above (see FIGS. 1, 5, and 6) was manufactured (hereinafter, "the working example"). A MOSFET having the structure of a conventional semiconductor device (see FIG. 19) was manufactured for comparison (hereinafter, "the comparison example").

FIG. 14 shows, for the working example, the relationship between forward voltage and forward current in the parasitic diode 44 when made to conduct current by applying a positive voltage to the source electrode (source pad 21) as an anode electrode and applying a negative voltage to the drain electrode 23 as a cathode electrode. Moreover, FIG. 15 shows, for the comparison example, the relationship between forward voltage and forward current in parasitic diodes 241 and 242 when made to conduct current by applying a positive voltage to the source electrode 221 as an anode electrode and applying a negative voltage to the drain electrode 223 as a cathode electrode.

The results shown in FIGS. 14 and 15 indicate that in the working example, the rate at which forward current increases as a function of increases in forward voltage applied to the parasitic diode 44 is smaller than in the comparison example. The reasons for this are as follows.

In the comparison example, a parasitic diode 241 is formed in the effective region 201a by the p-n junctions between the p$^+$ region 231, p-type base region 213, and p$^{++}$ contact region 215 and the n$^-$ drift region 212 and n$^+$ starting substrate 211. Moreover, due to the second p-type base region 233 being formed directly beneath the gate pad 222, a parasitic diode 242 is formed in the non-effective region 201b by the p-n junction between the second p-type base region 233 and the n$^-$ drift region 212 and n$^+$ starting substrate 211.

The parasitic diode 242 in the non-effective region 201b is connected in parallel to the parasitic diode 241 in the effective region 201a. Therefore, when a forward voltage is applied to the parasitic diode 241 in the effective region 201a, a forward voltage is also applied to the parasitic diode 242 in the non-effective region 201b that is connected in parallel to this parasitic diode 241, and these parallel-connected parasitic diodes 241 and 242 are driven simultaneously. As a result, in the comparison example, the total forward current that flows based on the magnitude of the forward voltage is the sum of the forward currents of the parasitic diodes 241 and 242 that are connected in parallel.

In contrast, in the working example, no p-type region is formed directly beneath the gate pad 22, and therefore no parasitic diode is formed in the non-effective region 1b. Thus, forward voltage is only applied to the parasitic diode 44 formed in the effective region 1a by the p-n junctions between the first and second p$^+$ regions 41 and 42, p-type base region 14, and p$^{++}$ contact region 16 and the n$^-$ drift region 12 and n$^+$ starting substrate 11. As a result, the total forward current that flows based on the magnitude of the forward voltage is only the forward current of the parasitic diode 44 in the effective region 1a. Therefore, in comparison to the comparison example, the forward voltage applied to the parasitic diode 44 can be increased.

When the working example is used for the MOSFETs 101 to 104 of the inverter in FIG. 18, the parasitic diodes 111 to 114 of the MOSFETs 101 to 104 correspond to the parasitic diode 44 of the working example. Therefore, the forward voltage applied to the parasitic diodes 111 to 114 of the MOSFETs 101 to 104 can be increased. This makes it possible to increase the proportion of transient current that gets distributed to the external SBDs 121 to 124 connected in parallel to the parasitic diodes 111 to 114 of the MOSFETs 101 to 104, thereby making it possible to achieve a configuration in which the parasitic diodes 111 to 114 of the MOSFETs 101 to 104 do not conduct current.

Furthermore, in the working example, although due to the fact that no parasitic diode is formed in the non-effective region 1b an avalanche of minority carriers occurs between the effective region 1a and the non-effective region 1b during the transient period in which the MOSFETs 101 to 104 (which are devices for an inverter) are switched from ON to OFF, concentration of current at the gate pad 22-side corner 14a' of the p-type base region extension 14' can still be inhibited. This is because no n$^+$ source region 15 is formed in the p-type base region extension 14', and therefore the p-type base region extension 14' portion does not function as a MOSFET. This makes it possible to inhibit decreases in the breakdown voltage of the MOSFET during the transient period in which the MOSFETs 101 to 104 (which are devices for an inverter) are switched from ON to OFF.

As described above, in Embodiment 1, due to the fact that no p-type region is formed directly beneath the gate pad of the semiconductor substrate for the MOSFET, no MOSFET parasitic diode is formed directly beneath the gate pad. Therefore, during the transient period in which the MOSFET (which is a device for an inverter) is switched from ON to OFF, a MOSFET parasitic diode only operates in the effective region of the semiconductor substrate for the MOSFET. This makes it possible to increase the forward voltage applied to the parasitic diode of the MOSFET, which causes transient current to flow only through an external SBD connected in anti-parallel to the MOSFET and to not flow through the parasitic diode of the MOSFET. This in turn makes it possible to inhibit formation of crystal defects in the semiconductor substrate for the MOSFET, thereby making it possible to provide a high-quality MOSFET.

Furthermore, in Embodiment 1, due to the fact that no n$^+$ source region is formed in the p-type base region extension adjacent to the region in which the gate pad is arranged, the p-type base region extension portion does not function as a MOSFET. Thus, during the transient period in which the MOSFET (which is a device for an inverter) is switched from ON to OFF, concentration of current at the gate pad-side corner of the p-type base region extension can be reduced. This makes it possible to inhibit decreases in the breakdown voltage of the MOSFET.

Embodiment 2

Figure 16:
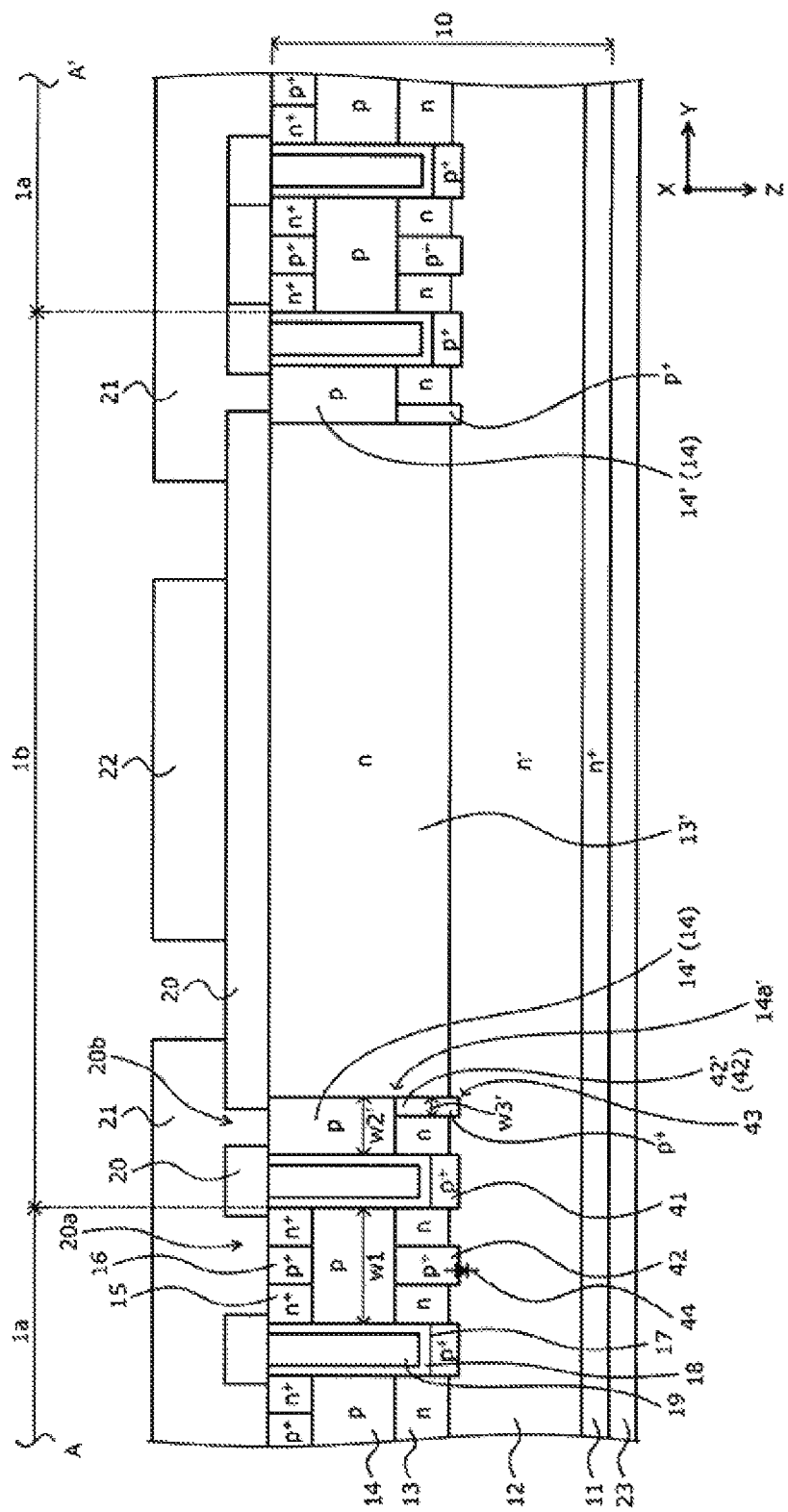
FIG. 16 is a cross-sectional view illustrating the structure of a semiconductor device according to Embodiment 2.

Next, the structure of a semiconductor device according to Embodiment 2 will be described. FIG. 16 is a cross-sectional view illustrating the structure of the semiconductor device according to Embodiment 2. The semiconductor device according to Embodiment 2 is different from the semiconductor device according to Embodiment 1 in that the second p$^+$ region 42' directly beneath the p-type base region extension 14' is arranged closer to the gate pad 22 than the center portion of the p-type base region extension 14'. Here, the gate pad 22-side face of the second p$^+$ region 42' directly beneath the p-type base region extension 14' should be continuous with the gate pad 22-side face of the p-type base region extension 14'.

In other words, the gate pad 22-side face of a p-type region constituted by the p-type base region extension 14' and the second p$^+$ region 42' directly therebeneath should be substantially planar. More specifically, the width w2' of the p-type base region extension 14' should be half of the width w2 of the p-type base region extension 14' in Embodiment 1 (see FIG. 5), for example. In addition, the width w3' of the second p$^+$ region 42' directly beneath the p-type base region extension 14' should be half of the width w3 of the second p⁺ region 42' directly beneath the p-type base region extension 14' in Embodiment 1 (see FIG. 5).

In Embodiment 2, current that flows within the semiconductor substrate 10 as a result of a minority carrier avalanche during a transient period in which the MOSFETs 101 to 104 (which are devices for an inverter) are switched from ON to OFF concentrates at a gate pad 22-side corner 43 of the second p⁺ region 42' directly beneath the p-type base region extension 14', thereby making breakdown more likely to occur at this corner 43. This makes it possible to further inhibit decreases in the breakdown voltage of the MOSFET. Here, the "gate pad 22-side corner 43 of the second p⁺ region 42' directly beneath the p-type base region extension 14'" refers to the boundary between the gate pad 22-side face and drain-side face of the second p⁺ region 42'.

Embodiment 2 as described above makes it possible to achieve the same advantageous effects as in Embodiment 1. Moreover, in Embodiment 2, current that flows within the semiconductor substrate as a result of a minority carrier avalanche during the transient period in which the MOSFET (which is a device for an inverter) is switched from ON to OFF can be concentrated at a location deeper from the front surface of the semiconductor substrate 10 than the gate pad-side corner of the p-type base region extension. This makes it possible to further inhibit decreases in the breakdown voltage of the MOSFET.

Embodiment 3

Figure 17:
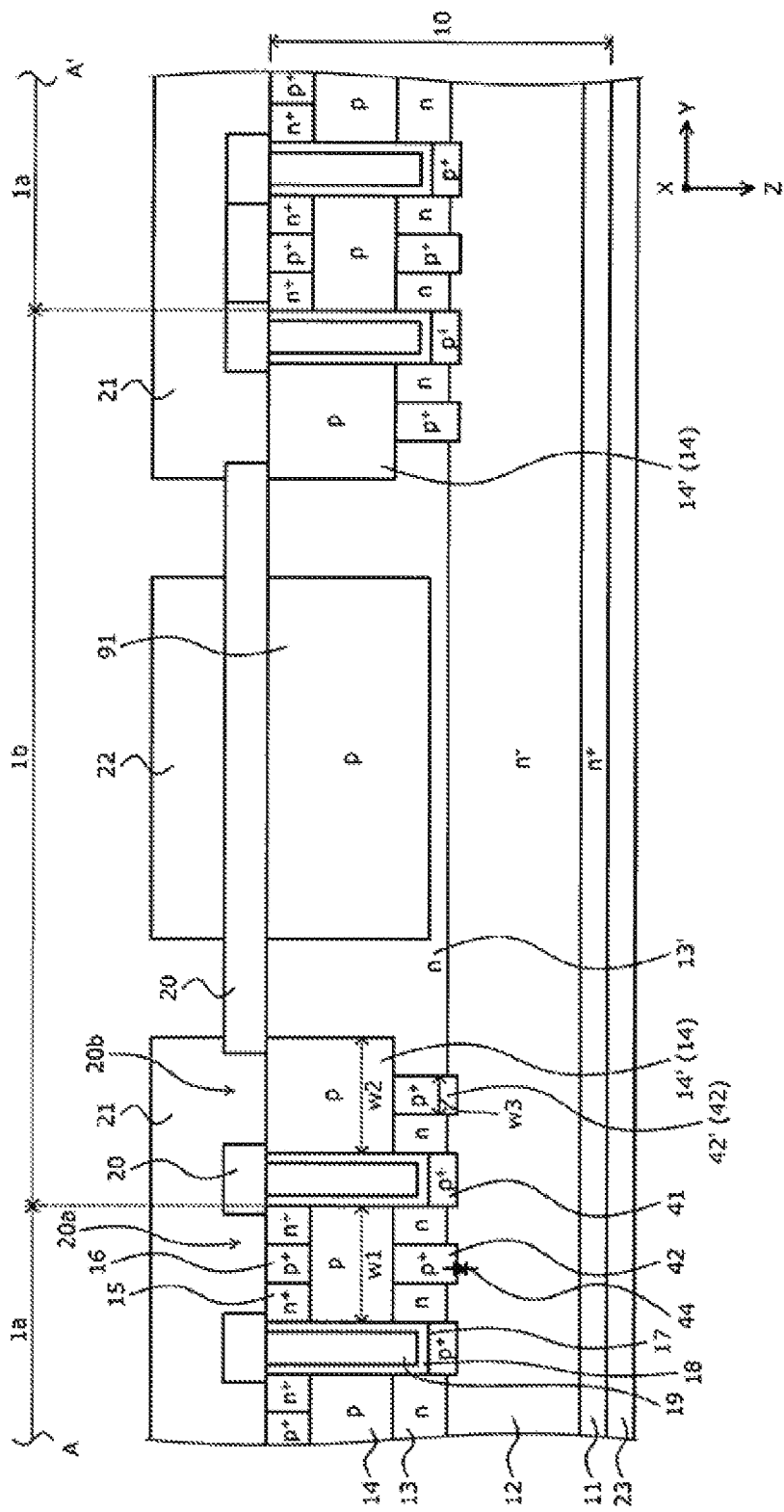
FIG. 17 is a cross-sectional view illustrating the structure of a semiconductor device according to Embodiment 3.

Next, the structure of a semiconductor device according to Embodiment 3 will be described. FIG. 17 is a cross-sectional view illustrating the structure of the semiconductor device according to Embodiment 3. The semiconductor device according to Embodiment 3 is different from the semiconductor device according to Embodiment 1 in that a second p-type base region (sixth semiconductor region) 91 is formed in the surface layer of the front surface of the semiconductor substrate 10 directly beneath the gate pad 22. The second p-type base region 91 is arranged separated from the p-type base region (hereinafter, "first p-type base region") 14 in the MOSFET in the effective region 1a and has a floating voltage.

The second p-type base region 91 faces the gate pad 22 in the depth direction Z with the interlayer insulating film 20 sandwiched therebetween. The second p-type base region 91 may reach down to a position deeper towards the drain side from the front surface of the semiconductor substrate 10 than the second p⁺ region 42. The impurity concentration of the second p-type base region 91 may be greater than the impurity concentration of the first p-type base region 14. The region between the second p-type base region 91 and the first p-type base region 14 is an n-type region 13'. No p⁺ contact region is formed within the second p-type base region 91.

In Embodiment 3 as described above, even though the second p-type base region is formed directly beneath the gate pad, setting this second p-type base region to a floating voltage prevents a parasitic diode formed by the p-n junction between the second p-type base region and the n⁻ drift region 12 and n⁺ starting substrate 11 from operating. Thus, similar to in Embodiment 1, during a transient period in which the MOSFET (which is a device for an inverter) is switched from ON to OFF, only the parasitic diode in the effective region operates, thereby making it possible to achieve the same advantageous effects as in Embodiments 1 and 2.

Moreover, in Embodiment 3, forming the second p-type base region directly beneath the gate pad makes it possible to improve the withstand capability to breakdown caused by current that flows within the semiconductor substrate during the transient period in which the MOSFET (which is a device for an inverter) is switched from ON to OFF.

The present invention is not limited to the embodiments described above, and various modifications may be made without departing from the spirit of the present invention. Moreover, the present invention is also applicable with wide-bandgap semiconductors other than silicon carbide such as gallium nitride (GaN), for example.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

INDUSTRIAL APPLICABILITY

As described above, the semiconductor device and semiconductor circuit device according to the present invention are suitable for use in power semiconductor devices used in power converters such as inverters, power supplies for various types of industrial machinery, and the like.

What is claimed is:

1. A semiconductor device having defined therein, in a plan view, a transistor region where one or more trench-gate field effect transistors are disposed and a pad region where one or more pads are disposed and transistors are absent, the semiconductor device comprising:
   a semiconductor substrate made of a semiconductor with a wider bandgap than silicon, the semiconductor substrate including:
      a bottom substrate of a first conductivity type;
      a lower semiconductor layer of the first conductivity type formed on the bottom substrate; and
      an upper semiconductor layer of a second conductivity type formed on the lower semiconductor layer as an uppermost layer of the semiconductor substrate,
   wherein in the transistor region, a source region of the first conductivity type is selectively formed and embedded within the upper semiconductor layer in a top surface of the semiconductor substrate, and a portion of the upper semiconductor layer other than the source region, including underneath the source region, is defined as a base region of the second conductivity type,
   wherein in the transistor region, the semiconductor device further comprises:
      a trench that penetrates from above through the source region and the base region thereunder and that reaches the lower semiconductor layer;
      a gate electrode formed inside the trench with a gate insulating film interposed therebetween;
      a source electrode that is formed over the top surface of the semiconductor substrate and that contacts the source region and is electrically connected to the base region; and
      a drain electrode that is formed on a bottom surface of the semiconductor substrate, and
   wherein in the pad region, the semiconductor device comprises:
      an interlayer insulating film on the top surface of the semiconductor substrate;

an electrode pad on the interlayer insulating film, the electrode pad being electrically separated from the source electrode so as to receive a voltage independently from a voltage to be applied to the source electrode; and a continuous region of the first conductivity type embedded in the upper semiconductor layer, the continuous region continuously spanning from the top surface of the semiconductor substrate and reaching the lower semiconductor layer.

2. The semiconductor device according to claim 1, wherein at or adjacent to a boundary between the transistor region and the pad region, the upper semiconductor layer of the second conductivity type laterally extends from a vertical wall of the trench in the transistor region into the pad region up to a prescribed lateral distance terminating at an edge of the continuous region, wherein said upper semiconductor layer that laterally extends into the pad region at least partially surrounds a periphery of a region in which the electrode pad is arranged, and wherein said upper semiconductor layer that laterally extends into the pad region does not have any embedded region of the first conductivity type therein.

3. The semiconductor device according to claim 2, wherein the upper semiconductor layer abutting another vertical wall of the trench includes said source region abutting said another vertical wall of the trench embedded therein.

4. The semiconductor device according to claim 1, further comprising in the transistor region:

a first region of the second conductivity type selectively formed in the lower semiconductor layer at a bottom of the trench, the first region being vertically separated from the base region and extending downwardly to a prescribed depth towards bottom surface; and a second region of the second conductivity type selectively formed in the lower semiconductor layer, laterally separated from the first region, the second region contacting the base region and extending downwardly to a prescribed depth towards the bottom surface.

5. The semiconductor device according to claim 4, wherein in the transistor region, the trench is provided in a plurality, and the second region contacts a center portion of the base region that are sandwiched by adjacent two trenches of the plurality of the trenches.

6. The semiconductor device according to claim 1, wherein at or adjacent to a boundary between the transistor region and the pad region, the upper semiconductor layer of the second conductivity type laterally extends from a vertical wall of the trench in the transistor region into the pad region up to a prescribed lateral distance terminating at an edge of the continuous region, and wherein in the pad region, a region of the second conductivity type is selectively formed in the lower semiconductor layer, contacting said upper semiconductor layer that laterally extends into the pad region and extending downwardly to a prescribed depth towards the bottom surface, said region of the second conductivity type contacting said upper semiconductor layer that laterally extends into the pad region at a position closer to an lateral extended edge of said upper semiconductor layer that laterally extends into the pad region than the vertical wall of the trench.

7. The semiconductor device according to claim 1, wherein in the pad region, in a plan view, said continuous region of the first conductivity type occupies at least an entire area underneath the electrode pad.

8. The semiconductor device according to claim 1, wherein an impurity concentration of said continuous region of the first conductivity type is greater than an impurity concentration of the lower semiconductor layer.

9. The semiconductor device according to claim 1, wherein said continuous region of the first conductivity type faces the electrode pad in a depth direction with the interlayer insulating film sandwiched therebetween.

10. The semiconductor device according to claim 1, further comprising in the pad region:

a floated region of the second conductivity type, electrically floated, spanning from the top surface of the semiconductor substrate to a prescribed depth, wherein the floated region faces the electrode pad in a depth direction with the interlayer insulating film sandwiched therebetween.

11. The semiconductor device according to claim 2, wherein in the pad region, a region of the second conductivity type is selectively formed in the lower semiconductor layer, contacting said upper semiconductor layer that laterally extends into the pad region and extending downwardly to a prescribed depth towards the bottom surface, said region of the second conductivity type contacting said upper semiconductor layer that laterally extends into the pad region at a position closer to an lateral extended edge of said upper semiconductor layer that laterally extends into the pad region than the vertical wall of the trench.

12. The semiconductor device according to claim 2, wherein in the pad region, in a plan view, said continuous region of the first conductivity type occupies at least an entire area underneath the electrode pad.

13. The semiconductor device according to claim 2, wherein an impurity concentration of said continuous region of the first conductivity type is greater than an impurity concentration of the lower semiconductor layer.

14. The semiconductor device according to claim 2, wherein said continuous region of the first conductivity type faces the electrode pad in a depth direction with the interlayer insulating film sandwiched therebetween.

15. The semiconductor device according to claim 2, further comprising in the pad region:

a floated region of the second conductivity type, electrically floated, spanning from the top surface of the semiconductor substrate to a prescribed depth, wherein the floated region faces the electrode pad in a depth direction with the interlayer insulating film sandwiched therebetween.

16. The semiconductor device according to claim 1, wherein said continuous region of the first conductivity type extends downwardly to an intermediate depth within the lower semiconductor layer, thereby a lower portion thereof being embedded in the lower semiconductor layer, and wherein an impurity concentration of said continuous region of the first conductivity type is greater than an impurity concentration of the lower semiconductor layer.

17. The semiconductor device according to claim 2, wherein said continuous region of the first conductivity type extends downwardly to an intermediate depth within the lower semiconductor layer, thereby a lower portion thereof being embedded in the lower semiconductor layer, and wherein an impurity concentration of said continuous region of the first conductivity type is greater than an impurity concentration of the lower semiconductor layer.

18. The semiconductor device according to claim 1, wherein the electrode pad is a gate pad electrically connected to the gate electrode.

19. A semiconductor circuit device, comprising:
the semiconductor device according to claim 1; and
a diode device that comprises:
- another semiconductor substrate of the first conductivity type made of a semiconductor with a wider bandgap than silicon;
- a region of the second conductivity type selectively formed in said another semiconductor substrate and exposed at a top surface of said another semiconductor substrate;
- an upper electrode formed on the top surface of said another semiconductor substrate, contacting said region of the second conductivity type, the upper electrode being electrically connected to the source electrode of the semiconductor device; and
- an ohmic electrode formed on a bottom surface of said another semiconductor substrate, the ohmic electrode being electrically connected to the drain electrode of the semiconductor device.

* * * * *